(12) United States Patent
Omura et al.

(10) Patent No.: US 7,471,374 B2
(45) Date of Patent: Dec. 30, 2008

(54) PROJECTION OPTICAL SYSTEM, EXPOSURE APPARATUS, AND EXPOSURE METHOD

(75) Inventors: Yasuhiro Omura, Kounosu (JP); Hironori Ikezawa, Fukaya (JP); Kumiko Ishida, Tokyo (JP)

(73) Assignee: Nikon Corporation, Tokyo (JP)

( * ) Notice: Subject to any disclaimer, the term of this patent is extended or adjusted under 35 U.S.C. 154(b) by 464 days.

(21) Appl. No.: 11/260,160

(22) Filed: Oct. 28, 2005

(65) Prior Publication Data
US 2006/0087633 A1   Apr. 27, 2006

Related U.S. Application Data

(63) Continuation-in-part of application No. PCT/JP2004/005957, filed on Apr. 23, 2004.

(30) Foreign Application Priority Data

May 1, 2003   (JP)   ............................ 2003-126091
Dec. 16, 2003   (JP)   ............................ 2003-418614

(51) Int. Cl.
*G03B 27/42*   (2006.01)
*G03B 27/52*   (2006.01)

(52) U.S. Cl. .......................................... 355/53; 355/30

(58) Field of Classification Search .................. 355/30, 355/52, 53, 55, 67–71; 359/859, 861
See application file for complete search history.

(56) References Cited

U.S. PATENT DOCUMENTS

| 4,346,164 | A | * | 8/1982 | Tabarelli et al. ............. 430/311 |
| 5,281,996 | A |  | 1/1994 | Bruning et al. |
| 5,825,043 | A |  | 10/1998 | Suwa |
| 5,969,441 | A |  | 10/1999 | Loopstra et al. |
| 6,208,407 | B1 |  | 3/2001 | Loopstra |
| 6,341,007 | B1 |  | 1/2002 | Nishi et al. |

(Continued)

FOREIGN PATENT DOCUMENTS

EP   0 834 773 A2   4/1998

(Continued)

OTHER PUBLICATIONS

M. Switkes et al.; "Resolution Enhancement of 157-nm Lithography by Liquid Immersion"; *SPIE 2002 Microlithography*; Massachusetts Institute of Technology.

*Primary Examiner*—Hung Henry Nguyen
(74) *Attorney, Agent, or Firm*—Oliff & Berridge, PLC

(57) ABSTRACT

A projection optical system and exposure method for forming a reduced image of a first surface on a second surface, including forming a projection exposure of a reduced image of a pattern formed on a mask on a photosensitive substrate, the optical path between the projection optical system and the second surface being filled with a medium having a refractive index larger than 1.1 where a refractive index of an atmosphere in the optical path of the projection optical system is 1, and the magnification of the projection optical system being not more than ⅛. In variations, the projection optical system is substantially telecentric on both the first surface side and the second surface side; every optical member having a power in the projection optical system is a transmitting optical member; and a projection exposure in a one shot-area can include a plurality of partial exposures in partial exposure regions.

36 Claims, 22 Drawing Sheets

U.S. PATENT DOCUMENTS

| | | |
|---|---|---|
| 6,400,441 B1 | 6/2002 | Nishi et al. |
| 6,549,269 B1 | 4/2003 | Nishi et al. |
| 6,590,634 B1 | 7/2003 | Nishi et al. |
| 6,864,961 B2 * | 3/2005 | Omura ................. 355/67 |
| 6,867,922 B1 * | 3/2005 | Terasawa et al. ............ 359/649 |
| 2001/0018153 A1 | 8/2001 | Irie |
| 2001/0019401 A1 | 9/2001 | Irie et al. |
| 2003/0043352 A1 | 3/2003 | Sudoh et al. |
| 2003/0053036 A1 | 3/2003 | Fujishima et al. |

FOREIGN PATENT DOCUMENTS

| | | |
|---|---|---|
| EP | 1 039 511 A1 | 9/2000 |
| EP | 1 359 608 A1 | 11/2003 |
| GB | 1 510 007 | 5/1978 |
| JP | A-06-124873 | 5/1994 |
| JP | A-06-188169 | 7/1994 |
| JP | A-10-303114 | 11/1998 |
| JP | A-10-340846 | 12/1998 |
| JP | A-2000-277415 | 10/2000 |
| JP | A-2001-318470 | 11/2001 |
| JP | A-2001-319871 | 11/2001 |
| JP | A-2002-118053 | 4/2002 |
| JP | A-2002-151397 | 5/2002 |
| WO | WO 99/31717 A1 | 6/1999 |
| WO | WO99/049504 | 9/1999 |
| WO | WO 99/49504 A1 | 9/1999 |
| WO | WO 02/31870 A1 | 4/2002 |
| WO | WO 03/007045 A1 | 1/2003 |

* cited by examiner

TRANSVERSE ABERRATION

MERIDIONAL — SAGITTAL

Y=15.5mm

Y=7.8mm

Y=0.0mm

TRANSVERSE ABERRATION

TRANSVERSE ABERRATION

MERIDIONAL                              SAGITTAL

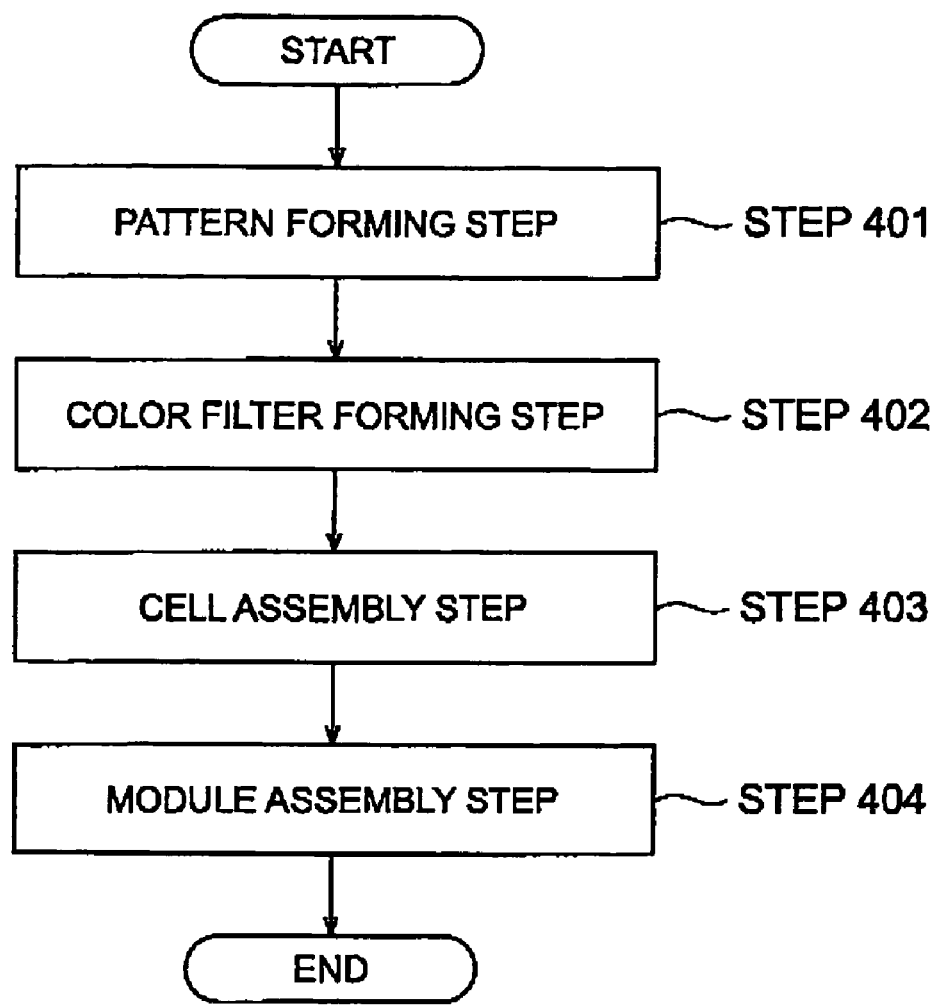

PROJECTION OPTICAL SYSTEM, EXPOSURE APPARATUS, AND EXPOSURE METHOD

RELATED APPLICATIONS

This is a Continuation-In-Part application of International Patent application serial No. PCT/JP2004/005957 filed on Apr. 23, 2004, now pending.

BACKGROUND OF THE INVENTION

1. Field of the Invention

The present invention relates to a projection optical system, exposure apparatus, and exposure method and, more particularly, to a high-resolution projection optical system suitable for exposure apparatus used in production of semiconductor devices, liquid-crystal display devices, etc. by photolithography.

2. Related Background Art

The photolithography for production of the semiconductor devices and others is implemented using a projection exposure apparatus for projecting a pattern image of a mask (or a reticle) through a projection optical system onto a wafer (or a glass plate or the like) coated with a photoresist or the like. The resolving power (resolution) required for the projection optical system of the projection exposure apparatus is becoming increasingly higher and higher with increase in integration degree of the semiconductor devices and others.

As a result, in order to satisfy the requirements for the resolving power of the projection optical system, it is necessary to shorten the wavelength λ of illumination light (exposure light) and to increase the image-side numerical aperture NA of the projection optical system. Specifically, the resolution of the projection optical system is expressed by k·λ/NA (where k is the process coefficient). The image-side numerical aperture NA is represented by n·sin θ, where n is a refractive index of a medium (normally, gas such as air) between the projection optical system and the photosensitive substrate (a wafer or the like) and θ a maximum angle of incidence to the photosensitive substrate.

In this case, if the maximum incidence angle θ is increased in order to increase the image-side numerical aperture, it will result in increasing the incidence angle to the photosensitive substrate and the emergence angle from the projection optical system, and therefore increasing reflection loss on optical surfaces. Thus it will fail to secure a large effective image-side numerical aperture. For this reason, as described later, there is the known technology of increasing the image-side numerical aperture by filling a medium like a liquid with a high refractive index in the optical path between the projection optical system and the photosensitive substrate.

On the other hand, as to the degree of difficulty of production of optical systems, the dioptric projection optical systems comprised of only refracting members have the difficulty degree lower than the catadioptric projection optical systems including a reflecting member, and thus the dioptric projection optical systems are more suitable for mass supply of exposure apparatus. In the dioptric projection optical systems, however, a lens unit with a positive refracting power and a lens unit with a negative refracting power need to be located with a space, in order to satisfy the Petzval's condition on the object side (mask side) with respect to the pupil thereof. For realizing the large image-side numerical aperture of not less than 1 as described above, the object-side numerical aperture also increases therewith.

In the dioptric projection optical systems, it will result in failing to well correct for off-axis aberrations such as coma and, in turn, failing to secure a large still exposure region (effective exposure region: effective imaging area) and to avoid an increase in the size of lenses. Then, it is also conceivable to adopt a method of setting the projection magnification (image magnification) of the projection optical system smaller than normal so as to keep the object-side numerical aperture at a low level, thereby well correcting for the off-axis aberrations and avoiding an increase in the size of lenses. However, if the projection magnification of the projection optical system is set smaller than normal, it will result in increasing the mask-side illumination area optically corresponding to a shot-area having a required size, and thus failing to cover this large illumination area by a currently predominating 6-inch reticle.

Nowadays, the exposure apparatus equipped with the projection optical system having the relatively large image-side numerical aperture adopts the step-and-scan system for implementing scanning exposure of a mask pattern in one shot-area on a wafer while moving the mask and wafer relative to the projection optical system. However, if a configuration wherein a medium is filled in the optical path between the projection optical system and the photosensitive substrate is adopted in order to achieve the large image-side numerical aperture, quick scanning exposure is impossible, for example, because of the intervention of the liquid-like medium, and it could cause a drop of throughput.

The present invention has been accomplished in view of the above problems and an object of the invention is to provide an exposure apparatus and exposure method capable of effecting high-resolution projection exposure with high throughput, while securing a large effective image-side numerical aperture through the intervention of a high-refractive-index medium in the optical path between the projection optical system and the photosensitive substrate, using the dioptric projection optical system easy to produce and the mask of the ordinary size.

SUMMARY OF THE INVENTION

In order to achieve the above object, an exposure method according to a first embodiment of the present invention is an exposure method of effecting a projection exposure of a reduced image of a pattern formed on a mask, through a projection optical system onto a photosensitive substrate, the exposure method comprising:

a filling step of filling an optical path between the projection optical system and the photosensitive substrate with a medium having a refractive index larger than 1.1, where a refractive index of an atmosphere in an optical path of the projection optical system is 1; and an exposure step of effecting a projection exposure in one shot-area on the photosensitive substrate, wherein the shot-area includes a plurality of partial exposure regions, and wherein the exposure step is to repeat an exposure in the partial exposure region more than once.

Another exposure method according to a second embodiment of the present invention is an exposure method of effecting a projection exposure of a reduced image of a pattern formed on a mask, through a projection optical system onto a photosensitive substrate, the exposure method comprising:

a filling step of filling an optical path between the projection optical system and the photosensitive substrate with a medium having a refractive index larger than 1.1, where a refractive index of an atmosphere in an optical path of the projection optical system is 1;

a first exposure step of performing a projection exposure in a first still exposure region on the photosensitive substrate in a state in which the mask and the photosensitive substrate are kept still relative to the projection optical system;

a moving step of moving at least the photosensitive substrate relative to the projection optical system, in order to perform a projection exposure in a second still exposure region not adjoining the first still exposure region subjected to the projection exposure in the first exposure step, the moving step being executed directly after the first exposure step; and a second exposure step of performing the projection exposure in the second still exposure region on the photosensitive substrate in the state in which the mask and the photosensitive substrate are kept still relative to the projection optical system the second exposure step being executed directly after the moving step.

An exposure apparatus according to a third embodiment of the present invention is an exposure apparatus for effecting a projection exposure of a reduced image of a pattern formed on a mask, through a projection optical system onto a photosensitive substrate, wherein an optical path between the projection optical system and the photosensitive substrate is filled with a medium having a refractive index larger than 1.1 where a refractive index of an atmosphere in an optical path of the projection optical system is 1, wherein the projection optical system has a still exposure region substantially smaller than one shot-area to be formed on the photosensitive substrate, and wherein the projection optical system repeats a projection exposure in a portion of the shot-area more than once in the projection exposure in the shot-area.

Another exposure apparatus according to a fourth embodiment of the present invention is an exposure apparatus for effecting a projection exposure of a reduced image of a pattern formed on a mask, through a projection optical system onto a photosensitive substrate, the exposure apparatus comprising:

a substrate stage which holds the photosensitive substrate in a movable state;

a supply unit which fills an optical path between the projection optical system and the photosensitive substrate with a medium having a refractive index larger than 1.1, where a refractive index of an atmosphere in an optical path of the projection optical system is 1; and a controller which controls at least the substrate stage so as to perform a projection exposure in a first still exposure region on the photosensitive substrate in a state in which the mask and the photosensitive substrate are kept still relative to the projection optical system, to, subsequent to the projection exposure in the first still exposure region, move at least the photosensitive substrate relative to the projection optical system in order to perform a projection exposure in a second still exposure region not adjoining the first still exposure region, and to, subsequent to the relative movement of the photosensitive substrate, perform the projection exposure in the second still exposure region on the photosensitive substrate in the state in which the mask and the photosensitive substrate are kept still relative to the projection optical system.

A projection optical system according to a fifth embodiment of the present invention is a projection optical system for forming a reduced image of a first surface on a second surface, wherein an optical path between the projection optical system and the second surface is filled with a medium having a refractive index larger than 1.1 where a refractive index of an atmosphere in an optical path of the projection optical system is 1, wherein every optical member having a power in the projection optical system is a transmitting optical member, wherein a magnification of the projection optical system is not more than $⅛$, and wherein the projection optical system is substantially telecentric on both the first surface side and the second surface side.

Another exposure method according to the sixth embodiment of the present invention is an exposure method of effecting a projection exposure of a reduced image of a pattern formed on a mask, through a projection optical system onto a photosensitive substrate, the exposure method comprising:

a preparation step of preparing the projection optical system having a magnification of not more than $⅛$;

a filing step of filling an optical path between the projection optical system and the photosensitive substrate with a medium having a refractive index larger than 1.1, where a refractive index of an atmosphere in an optical path of the projection optical system is 1; and an exposure step of effecting a projection exposure in one shot-area on the photosensitive substrate, wherein the exposure step is to perform the projection exposure in one shot-area including a plurality of partial exposure regions, and wherein the exposure step comprises a plurality of partial exposure steps each of which is to perform a projection exposure in the partial exposure region.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 19 is a flowchart of a method of producing a liquid-crystal display device as a microdevice.

DETAILED DESCRIPTION OF THE PREFERRED EMBODIMENTS

Figure 1:
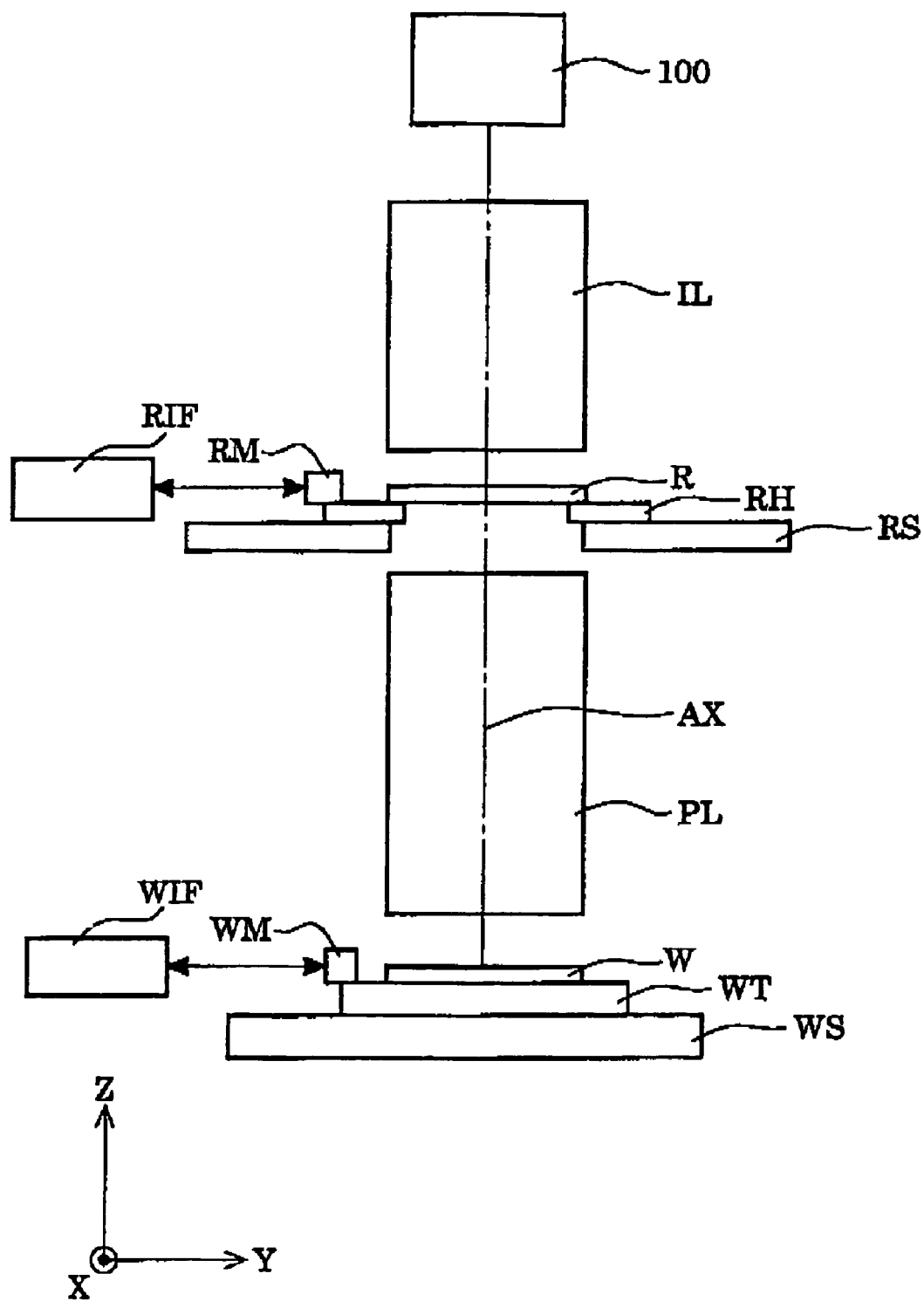
FIG. 1 is an illustration schematically showing a configuration of an exposure apparatus according to an embodiment of the present invention.

The present invention involves interposing the medium with the refractive index larger than 1.1 in the optical path between the projection optical system and the photosensitive substrate, thereby increasing the image-side numerical aperture NA of the projection optical system. In passing, "Resolution Enhancement of 157-nm Lithography by Liquid Immersion" reported in "Massachusetts Institute of Technology" in "SPIE2002 Microlithography" by Mr. M. Switkes and Mr. M. Rothschild describes Fluorinert (Perfluoropolyethers: trade name of 3M, USA) and Deionized Water as candidates for media having the required transmittance for light of wavelength $\lambda$ of not more than 200 nm.

In the present invention, as described above, the high-refractive-index medium, e.g., a liquid (or fluid) is interposed in the optical path between the projection optical system and the photosensitive substrate, whereby the high-resolution projection exposure can be performed while securing a large effective image-side numerical aperture.

A typical embodiment of the invention comprises performing a first still projection exposure in a partial exposure region having the size of about a half of one shot-area, for example, using the projection optical system having the projection magnification of not more than ⅕, and, after replacement of the mask, performing a second still projection exposure in the rest partial exposure region in the size of about half. In this configuration, the projection magnification of the projection optical system is set smaller than the normal projection magnification (i.e., ¼); therefore, the object-side numerical aperture does not substantially increase even if the image-side numerical aperture becomes larger than the ordinary values by virtue of the intervention of the high-refractive-index medium.

As a result, even with use of the dioptric projection optical system easy to manufacture, a satisfactorily large still exposure region can be secured by well correcting for the off-axis aberrations such as coma, and an increase in the size of lenses is also avoided. Since the mask is replaced with another between two still projection exposures in the partial exposure regions having the size of about a half of one shot-area, the 6-inch reticle, which is presently mainstream as a mask, can be used. Furthermore, the embodiment employs the configuration wherein the medium is filled in the optical path between the projection optical system and the photosensitive substrate in order to achieve the large image-side numerical aperture, and the still projection exposure is performed so as not to cause a drop of throughput due to the intervention of the medium, different from the case of scanning exposure.

In one the embodiment of the present invention, as described above, the high-resolution projection exposure can be performed with high throughput while securing the large effective image-side numerical aperture through the intervention of the high-refractive-index medium in the optical path between the projection optical system and the photosensitive substrate, using the dioptric projection optical system easy to manufacture and the mask of the ordinary size.

Incidentally, the current shot-area is a rectangular region of 33 mm×26 mm or 33 mm×22 mm. This is a shot-area that can be obtained by one-shot projection exposure using the reticle of 6-inch size and the projection optical system having the projection magnification of ¼. In the case where this shot-area is equally divided into two partial exposure regions and where two still projection exposures are carried out, the size of each partial exposure region is 26 mm×16.5 mm or 22 mm×16.5 mm. When the size of each partial exposure region is 26 mm×16.5 mm, it is feasible to perform the one-shot projection exposures using the reticle of 6-inch size and the projection optical system having the projection magnification of ⅕.

On the other hand, where the size of each partial exposure region is 22 mm×16.5 mm, it is feasible to perform the one-shot projection exposures using the reticle of the 6-inch size and the projection optical system having the projection magnification of ⅙. In passing, where the aforementioned shot-area is equally divided into four partial exposure regions and where four still projection exposures are carried out, the size of each partial exposure region is, for example, 13 mm×16.5 mm. In this case, since the still exposure regions can be relatively small, it is feasible to perform the one-shot projection exposures using the projection optical system having the ordinary projection magnification of ¼ and the reticle of 6-inch size.

If the large image-side numerical aperture of not less than 1 is intended to be realized in the projection optical system with the projection magnification of ¼ which is presently predominating, the object-side numerical aperture will also increase to some extent therewith. As a result, in the case of the dioptric projection optical system, the increase of the object-side numerical aperture could lead to failure in well correcting for the off-axis aberrations such as coma and, in tarn, failure in securing the large still exposure region (effective exposure region: effective imaging area), and it also becomes difficult to avoid an increase in the size of lenses.

Then, it is also conceivable to adopt a method of setting the projection magnification (image magnification) of the projection optical system smaller than normal so as to keep the object-side numerical aperture at a low level, thereby well correcting for the off-axis aberrations and also avoiding the increase in the size of lenses. However, where the projection magnification of the projection optical system is set smaller than normal, it will result in an increase in the mask-side illumination area optically corresponding to the shot-area having the required size and this large illumination area cannot be covered by the presently predominating 6-inch reticle.

In fact, IC devices and the like are constructed of a plurality of layers, and it is not the case that all the layers are exposed with use of the same exposure apparatus. Therefore, it is important to use the shot-areas common to the current exposure apparatus. Since the required size of the shot-areas is determined on the image side of the projection optical system, if the projection magnification of the projection optical system is set to a value smaller than current ¼, the required mask area will become larger than the current mask area. In other words, if the projection magnification of the projection optical system is made simply smaller than current ¼, the presently predominating 6-inch reticle will fail to cover the required shot-area.

However, since the magnification of the projection optical system according to another embodiment of the present invention is not more than ⅛, the object-side numerical aperture can be kept at a small level even if the image-side numerical aperture is kept large. As a result, even the dioptric projection optical system is able to well correct for the off-axis aberrations such as coma and, in turn, to secure the relatively large effective imaging area, without increase in the size of lenses.

Namely, according to another embodiment of the present invention, it is feasible to realize the dioptic projection optical system capable of securing the relatively large effective imaging area while securing the large effective image-side numerical aperture through the intervention of the high-refractive-index medium in the optical path to the image surface. The exposure apparatus and exposure method using the projection optical system according to another embodiment of the present invention involve repeating a still projection exposure in each partial exposure region four times in the projection exposure in one shot-area including four partial exposure regions, for example, using four separate 6-inch reticles. In this case, it is feasible to keep the maximum image height required for the projection optical system, at a low level and, in turn, to achieve miniaturization of the projection optical system.

The configuration of filling the medium in the optical path to the photosensitive substrate is adopted in order to achieve the large image-side numerical aperture, but the still projection exposures are carried out through the dioptric projection optical system, which does not cause a drop of throughput due to the intervention of the medium, different from the case of scanning exposure. As described above, the exposure apparatus and exposure method of the present invention use the dioptric projection optical system easy to manufacture and the mask of the normal size and are able to perform the high-resolution projection exposure with high throughput, while securing the large effective image-side numerical aperture through the intervention of the high-refractive-index medium in the optical path between the projection optical system and the photosensitive substrate.

The projection optical system according to another embodiment of the present invention preferably satisfies Condition (1) below, where L2 is the distance from the image-side pupil position to the image surface and LA the distance from the object surface (first surface) to the image surface, i.e., object-image distance.

$$0.18 < L2/LA < 0.245 \quad (1)$$

The range below the lower limit of Condition (1) is undesirable because it becomes difficult to correct for coma, astigmatism, and the like and to obtain an effective imaging area. On the other hand, the range above the upper limit of Condition (1) is undesirable because the size of the optical system becomes larger. Namely, when the projection optical system satisfies Condition (1), the reduction projection optical system can be constructed in the feasible size while securing the necessary and sufficient effective imaging area. For better demonstrating the effect of the present embodiment, the lower limit of Condition (1) is preferably set to 0.2 and the upper limit thereof to 0.24.

The projection optical system according to another embodiment of the present invention preferably has at least one variable aperture stop disposed at or near the image-side pupil position. This configuration permits us to select an optimal numerical pre for imaging with respect to masks having a variety of patterns. Furthermore, by disposing two variable aperture stops with a space along the optical-axis direction, it becomes feasible to uniformize the pupil shape throughout the entire effective imaging area at a variety of numerical apertures. For the detailed operational effect of the two variable aperture stops disposed with a space in the optical-axis direction, reference should be made to Japanese Patent Application Laid-Open No. 2002-118053 and WO02/31870 corresponding thereto.

The projection optical system according to another embodiment of the present invention preferably has a first lens unit with a positive refracting power, a second lens unit with a negative refracting power, a third lens unit with a positive refracting power, a fourth lens unit with a negative refracting power, a fifth lens unit with a positive refracting power, an aperture stop, and a sixth lens unit with a positive refracting power, and satisfies Condition (2) below.

$$0.04 < P2/PX < 0.2 \quad (2)$$

In Condition (2), where a size of an area occupied on each optical surface by a beam from a point on the optical axis of the object surface is defined as a partial diameter, PX is a maximum partial diameter in the projection optical system and P2 a minimum partial diameter in the second lens unit. For the general definition of the partial diameter (partial size: partial beam size[diameter]), reference should be made to Paragraph [0032] and FIG. 3 of Japanese Patent Application Laid-Open No. 2002-151397, and to Paragraphs [0084]-[0089] and FIG. 14 of Japanese Patent Application Laid-Open No. 2002-258131 (and Paragraphs [0114]-[0119] and FIG. 14 of European Patent Publication EP1359608 corresponding thereto).

When Condition (2) is met, it is feasible to efficiently satisfy the Petzval's condition and to realize good imaging performance with excellent flatness. Namely, the range below the lower limit of Condition (2) is undesirable because a sufficient working distance cannot be secured on the mask side and mechanical interference of a mask stage becomes likely to occur in application to the exposure apparatus. On the other hand, the range over the upper limit of Condition (2) is undesirable because it becomes difficult to avoid an increase of the lens diameter or degradation of aberration performance (the Petzval's condition). For better demonstrating the effect of the present embodiment, the lower limit of Condition (2) is preferably set to 0.06 and the upper limit thereof to 0.15.

The projection optical system according to another embodiment of the present invention preferably satisfies Condition (3) below, in addition to above-described Condition (2). In Condition (3), D4 is a minimum clear aperture radius of a lens in the fourth lens unit and D0 a clear aperture radius of the object surface (a mask in application to the exposure apparatus).

$$0.4 < D4/D0 < 0.9 \quad (3)$$

The range below the lower limit of Condition (3) is undesirable because it becomes infeasible to achieve a sufficiently large image-side numerical aperture. On the other hand, the range above the upper limit of Condition (3) is undesirable because it becomes difficult to avoid an increase in the lens diameter or degradation of aberration performance (the Petzval's condition). For better demonstrating the effect of the present embodiment, the lower limit of Condition (3) is preferably set to 0.5 and the upper limit to 0.87.

Alternatively, the projection optical system according to another embodiment of the present invention preferably has a first lens unit with a negative refracting power, a second lens unit with a positive refracting power, a third lens unit with a negative refracting power, a fourth lens unit with a positive refracting power, an apelike stop, and a fifth lens unit with a positive refracting power, and satisfies Condition (4) below. In Condition (4), PX is the maximum partial diameter in the projection optical system as described above, and P3 a minimum partial diameter in the third lens unit.

$$0.07 < P3/PX < 0.23 \quad (4)$$

When Condition (4) is met, it is feasible to efficiently satisfy the Petzval's condition and to realize good imaging performance with excellent flatness. Namely, the range below the lower limit of Condition (4) is undesirable because a sufficient working distance cannot be secured on the mask side and mechanical interference of the mask stage becomes likely to occur in application to the exposure apparatus. On the other hand, the range above the upper limit of Condition (4) is undesirable because it becomes difficult to avoid an increase in the lens size or degradation of aberration performance (the Petzval's condition). For better demonstrating the effect of the present embodiment, the lower limit of Condition (4) is preferably set to 0.1 and the upper limit to 0.21.

The projection optical system according to another embodiment of the present invention preferably satisfies Condition (5) below, in addition to above-described Condition (4). In Condition (5), D3 is a minimum clear aperture radius of a lens in the third lens unit, and D0 a clear aperture radius of the object surface (the mask in application to the exposure apparatus).

$$0.35 < D3/D0 < 0.85 \quad (5)$$

The range below the lower limit of Condition (5) is undesirable because it becomes infeasible to realize a sufficiently large image-side numerical aperture. On the other hand, the range above the upper limit of Condition (5) is undesirable because it becomes difficult to avoid an increase in the lens diameter or degradation of aberration performance (the Petzval's condition). For better demonstrating the effect of the present embodiment, the lower limit of Condition (5) is preferably set to 0.4 and the upper limit thereof to 0.8.

An embodiment of the present invention will be described below on the basis of the accompanying drawings.

FIG. 1 is an illustration schematically showing a configuration of an exposure apparatus according to an embodiment of the present invention, wherein the Z-axis is set in parallel with the optical axis AX of a projection optical system PL, the Y-axis in parallel with the plane of FIG. 1 within the plane normal to the optical axis AX, and the X-axis normal to the plane of FIG. 1. The exposure apparatus depicted is provided with an ArF excimer laser source as a light source 100 for supplying illumination light in an ultraviolet region.

Light emitted from the light source 100 travels through an illumination optical system IL to illuminate a reticle R with a predetermined pattern formed thereon, in a superimposed manner. The optical path between the light source 100 and illumination optical system IL is hermetically sealed in a casing (not shown), and the space from the light source 100 to the optical member closest to the reticle in the illumination optical system IL is replaced with an inert gas such as helium gas or nitrogen being gas with small absorptance for the exposure light, or maintained in a nearly vacuum state.

The reticle R is kept in parallel with the XY plane on a reticle stage RS, through a reticle holder RH. A pattern to be transcribed is formed on the reticle R, and a rectangular pattern area is illuminated. The reticle stage RS is two-dimensionally movable along the reticle surface (i.e., the XY plane) by action of a driving system not illustrated, and is configured so that coordinates of the position thereof are measured by an interferometer RIF using a reticle moving mirror RM and so that the position thereof is controlled based thereon.

Light from the pattern formed on the reticle R is guided through the projection optical system PL to form a reticle pattern image on a wafer W being a photosensitive substrate. The wafer W is kept in parallel with the XY plane on a wafer stage WS, through a wafer holder table WT. Then the pattern image is formed in a still exposure region of rectangular shape on the wafer W so as to optically correspond to the rectangular illumination area on the reticle R. The wafer stage WS is two-dimensionally movable along the wafer surface (i.e., the XY plane) by action of a driving system not shown, and is configured so that coordinates of the position thereof are measured by an interferometer WIF using a wafer moving mirror WM and so that the position thereof is controlled based thereon.

In the exposure apparatus of the present embodiment, the interior of the projection optical system PL is arranged to be kept hermetically sealed between an optical member located nearest to the reticle (lens L1 or plane-parallel plate P1 in each example) and a boundary lens Lb located nearest to the wafer among optical members constituting the projection optical system PL, and the gas inside the projection optical system PL is replaced with an inert gas such as helium gas or nitrogen, or kept in a nearly vacuum state. Furthermore, the reticle R and reticle stage RS are arranged on the narrow optical path between the illumination optical system IL and the projection optical system PL, and an interior of a casing (not shown) hermetically enclosing the reticle R and reticle stage RS is filled with an inert gas such as nitrogen or helium gas, or kept in a nearly vacuum state.

Figure 2:
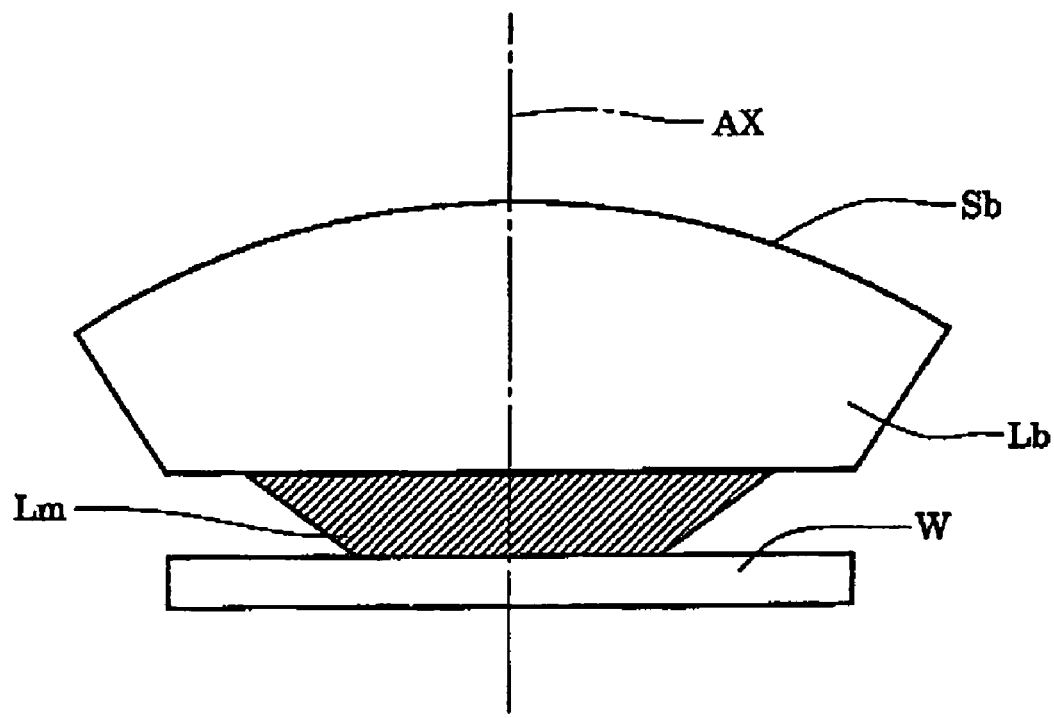
FIG. 2 is an illustration schematically showing a configuration between a boundary lens and a wafer in each example.

FIG. 2 is an illustration schematically showing the configuration between the boundary lens and the wafer in each example. Referring to FIG. 2, in each example the boundary lens Lb located nearest to the wafer in the projection optical system PL has a convex surface kept toward the reticle. In other words, the reticle-side surface Sb of the boundary lens Lb has a positive refracting power. The optical path between boundary lens Lb and wafer W is filled with a medium Lm having a refractive index larger than 1.1. In the first to third examples, deionized water is used as the medium Lm. In the fourth and fifth examples, pure water is used as the medium Lm.

The interior of the optical path between boundary lens Lb in the projection optical system PL and wafer W can be continuously kept filled with the liquid medium Lm, for example, by the technology disclosed in PCT International Publication WO99/49504, the technology disclosed in Japanese Patent Application Laid-Open No. 10-303114 and U.S. Pat. No. 5,825,043, and so on. In the technology disclosed in PCT International Publication WO99/49504, a liquid (medium Lm) adjusted at a predetermined temperature is supplied from a liquid supply device through a supply tube and a discharge nozzle so as to fill the optical path between boundary lens Lb and wafer W, and the liquid is collected from on the wafer W through a collection tube and an inflow nozzle by the liquid supply device.

On the other hand, in the technology disclosed in Japanese Patent Application Laid-Open No. 10-303114 and U.S. Pat. No. 5,825,043, the wafer holder table WT is constructed in such a receptacle shape as to be able to accommodate the liquid (medium Lm), and the wafer W is positioned and held by vacuum suction at the center of the inner bottom part (in the liquid). The distal part of the lens barrel of the projection optical system PL is arranged to reach the inside of the liquid and, in turn, the wafer-side optical surface of the boundary lens Lb is arranged to reach the inside of the liquid. WO99/49509 and U.S. Pat. No. 5,825,043 are each incorporated herein by reference in their entireties.

As described above, an atmosphere with little absorption of the exposure light is created throughout the entire optical path from light source 100 to wafer W. Accordingly, the driving systems, the interferometers (RIF, WIF), and others are used to perform the one-shot exposure while two-dimensionally driving and controlling the wafer W in the plane (XY plane) perpendicular to the optical axis AX of the projection optical system PL, whereby the pattern of reticle R is sequentially projected into shot-areas of wafer W by the so-called step-and-repeat method.

In each example, the lens components constituting the projection optical system PL are made of silica ($SiO_2$) or fluorite ($CaF_2$). The emission center wavelength of the ArF excimer laser light being the exposure light is 193.306 nm, the refractive index of silica for this center wavelength is 1.5603261, and the refractive index of fluorite is 1.5014548. Furthermore, in the first to third examples, deionized water having the refractive index of 1.47 for the exposure light is used as the medium Lm interposed between the boundary lens Lb and the wafer W. In each of the examples, the projection optical system PL is arranged to be substantially telecentric on both the object side and the image side.

In each example, an aspherical surface is expressed by mathematical expression (a) below, where y is a height in a direction normal to the optical axis, z a distance (sag) along the optical axis from a tangent plane at an apex of the aspherical surface to a position at the height y on the aspherical surface, r a radius of curvature at the apex, κ a conical coefficient, and $C_n$ aspherical coefficients of order n. In each example, a lens surface formed in aspherical shape is accompanied by mark * on the right side to a surface number.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14} \quad (a)$$

FIRST EXAMPLE

Figure 3:
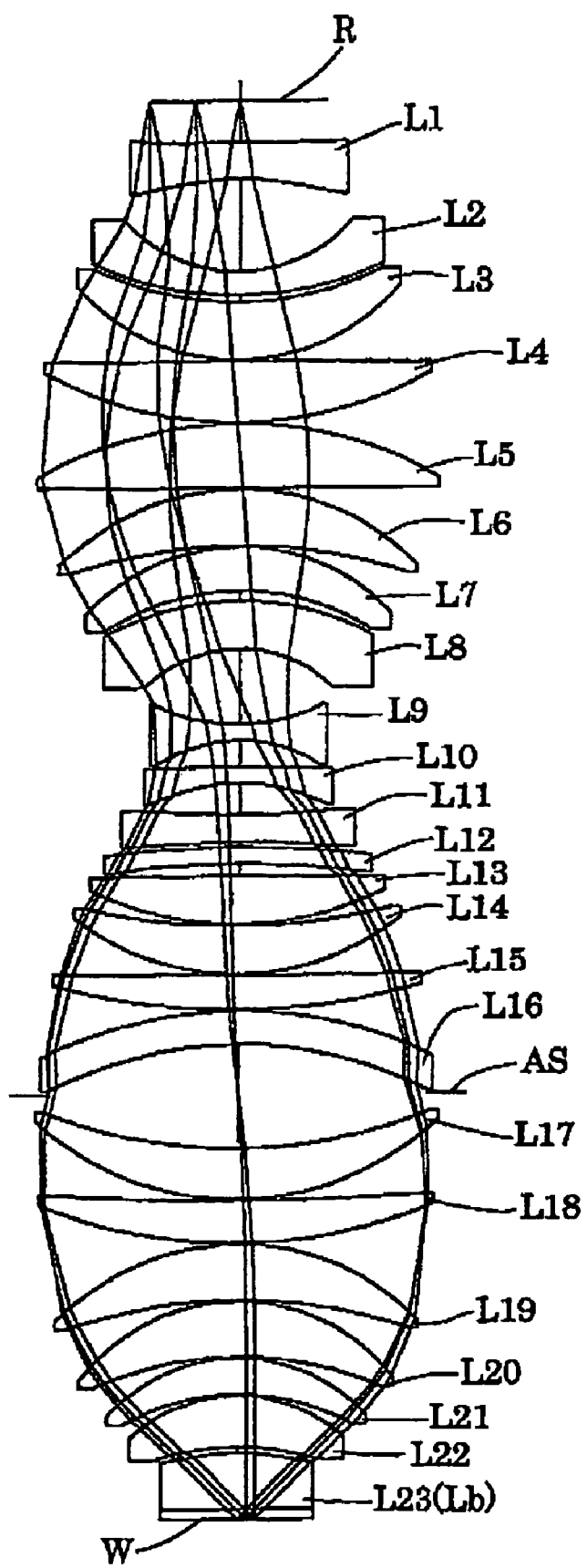
FIG. 3 is an illustration showing a lens configuration of a projection optical system according to the first example of the embodiment of the present invention.

FIG. 3 is an illustration showing a lens configuration of a projection optical system according to the first example of the present embodiment. With reference to FIG. 3, the projection optical system PL of the first example is composed of the following components arranged in order from the reticle side: a biconcave lens L1 whose concave surface of aspherical shape is kept toward the wafer; a negative meniscus lens L2 whose concave surface is kept toward the reticle; a positive meniscus lens L3 whose concave surface of aspherical shape is kept toward the reticle; a biconvex lens L4; a biconvex lens L5 whose convex surface of aspherical shape is kept toward the reticle; a positive meniscus lens L6 whose convex surface of aspherical shape is kept toward the reticle; a positive meniscus lens L7 whose concave surface of aspherical shape is kept toward the wafer; a negative meniscus lens L8 whose convex surface is kept toward the reticle; a biconcave lens L9 whose concave surface of aspherical shape is kept toward the reticle; a negative meniscus lens L10 whose concave surface of aspherical shape is kept toward the wafer, a biconcave lens L11 whose concave surface of aspherical shape is kept toward the wafer; a positive meniscus lens L12 whose concave surface of aspherical shape is kept toward the wafer; a biconvex lens L13; a positive meniscus lens L14 whose concave surface is kept toward the reticle; a positive meniscus lens L15 whose concave surface is kept toward the reticle; a negative meniscus lens L16 whose concave surface of asphercal shape is kept toward the wafer, an aperture stop AS; a positive meniscus lens L17 whose concave surface is kept toward the reticle; a positive meniscus lens L18 whose concave surface is kept toward the reticle; a positive meniscus lens L19 whose convex surface is kept toward the reticle; a positive meniscus lens L20 whose convex surface is kept toward the reticle; a positive meniscus lens L21 whose concave surface of aspherical shape is kept toward the wafer, a positive meniscus lens L22 whose convex surface is kept toward the reticle; and a planoconvex lens L23 (boundary lens Lb) whose plane is kept toward the wafer.

In the first example, the optical path between the planoconvex lens L23 as the boundary lens Lb and the wafer W is filled with the medium Lm consisting of deionized water. The lenses L22 and L23 (Lb) are made of fluorite and the other lens components are made of silica.

Table (1) below presents values of specifications of the projection optical system PL in the first example. In Table (1), λ indicates the center wavelength of the exposure light, β the projection magnification (the imaging magnification of the entire system), and NA the image-side (wafer-side) numerical aperture. Each surface number represents an order of a surface from the reticle side, r a radius of curvature of each surface (in the case of an aspherical surface, a radius of curvature at the apex: mm), d an axial spacing or surface separation of each surface (mm), and n a refractive index for the center wavelength. The notations in Table (1) also apply to Tables (2) and (3) hereinafter.

TABLE 1

(Principal Specifications)

λ = 193.306 nm
β = ⅕
NA = 1.04

(Specifications of Optical Members)

| Surface No. | r | d | n | Optical Member |
|---|---|---|---|---|
|  | (reticle surface) | 35.85155 |  |  |
| 1 | −2116.15637 | 29.98465 | 1.5603261 | (L1) |
| 2* | 228.85023 | 79.18317 |  |  |
| 3 | −133.07210 | 20.30251 | 1.5603261 | (L2) |
| 4 | −306.24503 | 6.03952 |  |  |
| 5* | −266.95498 | 49.96183 | 1.5603261 | (L3) |
| 6 | −187.00872 | 1.00000 |  |  |
| 7 | 14334.34417 | 54.42808 | 1.5603261 | (L4) |
| 8 | −341.42581 | 1.00000 |  |  |
| 9* | 345.43150 | 57.60721 | 1.5603261 | (L5) |
| 10 | −31743139.73000 | 1.00000 |  |  |
| 11* | 211.82132 | 49.45639 | 1.5603261 | (L6) |
| 12 | 455.88811 | 1.00000 |  |  |
| 13 | 180.28560 | 39.08205 | 1.5603261 | (L7) |
| 14* | 221.90022 | 8.59172 |  |  |
| 15 | 235.16731 | 43.22341 | 1.5603261 | (L8) |
| 16 | 116.00174 | 67.18556 |  |  |
| 17* | −195.60629 | 14.00000 | 1.5603261 | (L9) |
| 18 | 130.52857 | 23.53252 |  |  |
| 19 | 2316.66653 | 14.00000 | 1.5603261 | (L10) |
| 20* | 141.36693 | 28.05905 |  |  |
| 21 | −832.06692 | 24.80161 | 1.5603261 | (L11) |
| 22* | 781.19507 | 4.33285 |  |  |

TABLE 1-continued

| 23  | 949.75316  | 14.83956 | 1.5603261 | (L12) |
|-----|------------|----------|-----------|-------|
| 24* | 1429.30650 | 10.70117 |           |       |
| 25  | 7753.09495 | 42.50839 | 1.5603261 | (L13) |
| 26  | −297.15092 | 1.58607  |           |       |
| 27  | −576.53063 | 43.01673 | 1.5603261 | (L14) |
| 28  | −227.50556 | 1.00000  |           |       |
| 29  | −8764.75335| 30.82364 | 1.5603261 | (L15) |
| 30  | −595.27589 | 1.00000  |           |       |
| 31  | 379.04693  | 30.00000 | 1.5603261 | (L16) |
| 32* | 349.61368  | 44.68287 |           |       |
| 33  | ∞          | 48.22674 |           | (AS)  |
| 34  | −448.39487 | 45.40892 | 1.5603261 | (L17) |
| 35  | −255.95110 | 1.00000  |           |       |
| 36  | −2463.02432| 37.63340 | 1.5603261 | (L18) |
| 37  | −457.33179 | 1.00000  |           |       |
| 38  | 219.60702  | 49.49656 | 1.5603261 | (L19) |
| 39  | 458.07732  | 1.00000  |           |       |
| 40  | 172.37588  | 49.09143 | 1.5603261 | (L20) |
| 41  | 318.22764  | 1.08037  |           |       |
| 42  | 154.21994  | 31.79043 | 1.5603261 | (L21) |
| 43* | 209.87548  | 1.17547  |           |       |
| 44  | 140.16986  | 44.87373 | 1.5014548 | (L22) |
| 45  | 231.31932  | 5.59159  |           |       |
| 46  | 256.60953  | 49.92220 | 1.5014548 | (L23:Lb) |
| 47  | ∞          | 8.92710  | 1.47      | (Lm)  |
|     | (wafer surface) |     |           |       |

(Aspherical Data)

Figure 4:
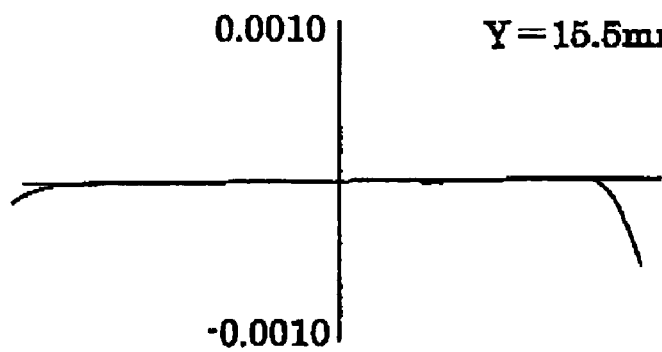
FIG. 4 is an illustration showing the averse aberration in the first example.
Figure 4:
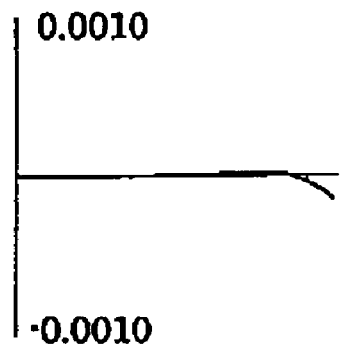
Figure 4:
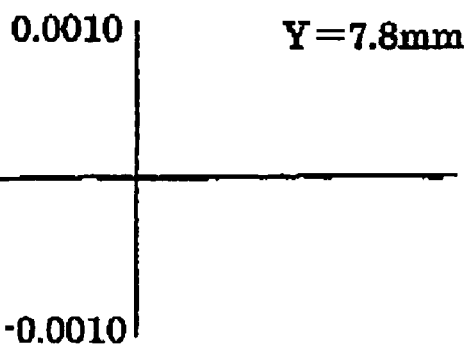
Figure 4:
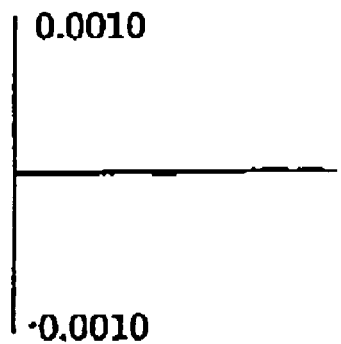
Figure 4:
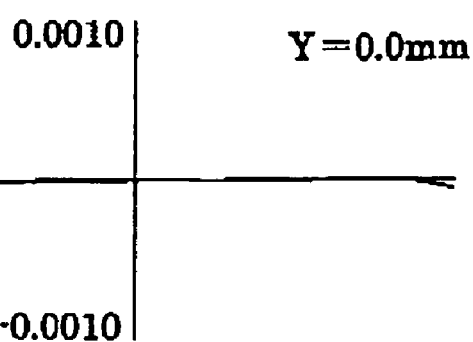
Figure 4:
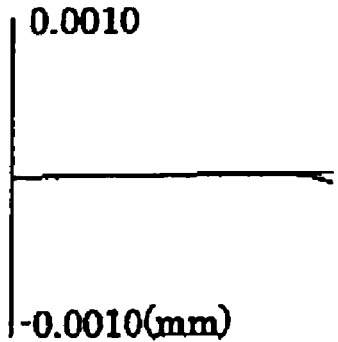

2nd surface $\kappa = 0$
$C_4 = -1.15575 \times 10^{-7}$   $C_6 = 3.70303 \times 10^{-12}$
$C_8 = -1.15277 \times 10^{-16}$   $C_{10} = 5.41093 \times 10^{-21}$
$C_{12} = -1.40182 \times 10^{-25}$   $C_{14} = 1.39491 \times 10^{-29}$ 5th surface $\kappa = 0$
$C_4 = 1.03612 \times 10^{-8}$   $C_6 = -2.91646 \times 10^{-13}$
$C_8 = 2.00780 \times 10^{-17}$   $C_{10} = -6.27346 \times 10^{-22}$
$C_{12} = 1.61307 \times 10^{-26}$   $C_{14} = 1.91457 \times 10^{-31}$ 9th surface $\kappa = 0$
$C_4 = -7.06471 \times 10^{-11}$   $C_6 = 3.77351 \times 10^{-15}$
$C_8 = 7.71113 \times 10^{-19}$   $C_{10} = 2.18015 \times 10^{-23}$
$C_{12} = -2.56756 \times 10^{-28}$   $C_{14} = -3.93049 \times 10^{-33}$ 11th surface $\kappa = 0$
$C_4 = -1.96404 \times 10^{-9}$   $C_6 = 8.50314 \times 10^{-14}$
$C_8 = -3.99897 \times 10^{-18}$   $C_{10} = -7.19500 \times 10^{-23}$
$C_{12} = 9.44512 \times 10^{-28}$   $C_{14} = -1.72884 \times 10^{-31}$ 14th surface $\kappa = 0$
$C_4 = 1.56401 \times 10^{-8}$   $C_6 = 1.34769 \times 10^{-13}$
$C_8 = -2.96395 \times 10^{-18}$   $C_{10} = -1.41277 \times 10^{-21}$
$C_{12} = 4.18316 \times 10^{-26}$   $C_{14} = -6.92529 \times 10^{-30}$ 17th surface $\kappa = 0$
$C_4 = -1.51297 \times 10^{-7}$   $C_6 = 8.60926 \times 10^{-12}$
$C_8 = -1.71366 \times 10^{-16}$   $C_{10} = -4.09208 \times 10^{-20}$
$C_{12} = 6.40069 \times 10^{-24}$   $C_{14} = -3.08505 \times 10^{-28}$ 20th surface $\kappa = 0$
$C_4 = -1.27228 \times 10^{-7}$   $C_6 = 2.30534 \times 10^{-13}$
$C_8 = 2.42493 \times 10^{-16}$   $C_{10} = -7.01920 \times 10^{-20}$
$C_{12} = 6.45623 \times 10^{-24}$   $C_{14} = -2.48833 \times 10^{-28}$ 22nd surface $\kappa = 0$
$C_4 = -3.68686 \times 10^{-8}$   $C_6 = 2.41845 \times 10^{-12}$
$C_8 = -8.36437 \times 10^{-17}$   $C_{10} = 4.79895 \times 10^{-21}$
$C_{12} = 1.98835 \times 10^{-26}$   $C_{14} = -2.10246 \times 10^{-29}$ TABLE 1-continued 24th surface $\kappa = 0$
$C_4 = 4.95564 \times 10^{-8}$   $C_6 = -1.99801 \times 10^{-12}$
$C_8 = -4.33859 \times 10^{-17}$   $C_{10} = 2.96335 \times 10^{-21}$
$C_{12} = 1.89632 \times 10^{-26}$   $C_{14} = -1.60076 \times 10^{-30}$ 32nd surface $\kappa = 0$
$C_4 = 2.82563 \times 10^{-11}$   $C_6 = -2.05877 \times 10^{-15}$
$C_8 = -7.92881 \times 10^{-19}$   $C_{10} = 3.75437 \times 10^{-23}$
$C_{12} = -7.11351 \times 10^{-28}$   $C_{14} = 5.47614 \times 10^{-33}$ 43rd surface $\kappa = 0$
$C_4 = -1.18002 \times 10^{-9}$   $C_6 = 5.44281 \times 10^{-13}$
$C_8 = 3.74194 \times 10^{-18}$   $C_{10} = 4.03055 \times 10^{-22}$
$C_{12} = -1.76801 \times 10^{-26}$   $C_{14} = 1.60457 \times 10^{-30}$ FIG. 4 is a diagram showing the transverse aberration in the first example. In the aberration diagram, Y indicates the image height. As apparent from the aberration diagram of FIG. 4, the aberration is well corrected for within the image circle with the radius of 15.5 mm though the very large image-side numerical aperture (NA=1.04) is secured using the ArF excimer laser light in the dioptric projection optical system with the projection magnification of ⅕ in the first example.

Figure 5:
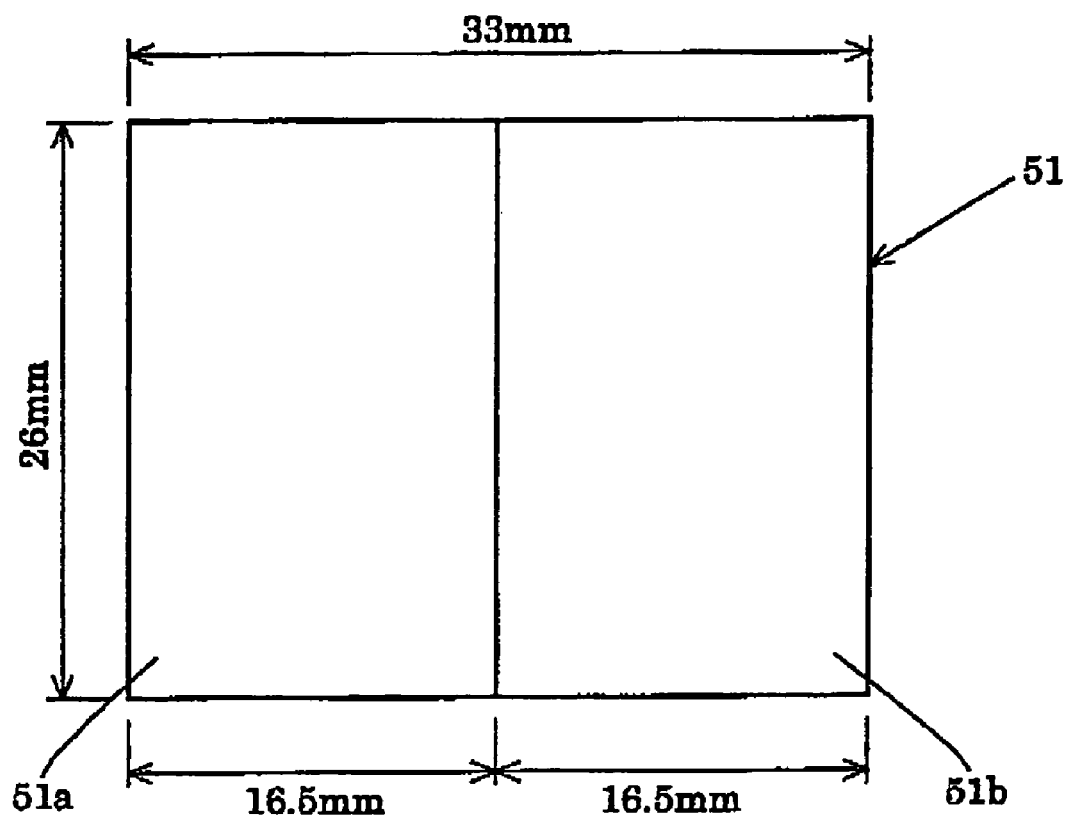
FIG. 5 is an illustration showing the relationship between a shot-area and partial exposure regions in the first example.

FIG. 5 is an illustration showing the relationship between a shot-area and partial exposure regions in the first example. In the first example, as shown in FIG. 5, a shot-area 51 of 33 mm×26 mm is divided into two partial exposure regions 51a and 51b having the size of 26 mm×16.5 mm. Here each of partial exposure regions 51a and 51b is set in the size included in the image circle with the radius of 15.5 mm. In passing, the shot-area 51 has the size not included in the image circle with the radius of 15.5 mm.

In the first example, a still projection exposure is carried out in the first partial exposure region 51a having the size of a half of the shot-area 51, using a first reticle R1 of 6-inch size. Then the first reticle R1 is replaced with a second reticle R2 of 6-inch size. Finally, a still projection exposure is carried out in the second partial exposure region 51b having the size of a half of the shot-area 51, using the second reticle R2. In the first example, since the projection magnification of the projection optical system PL is set at ⅕ which is smaller than ordinary ¼, it is feasible to keep the object-side numerical aperture at a small level in spite of the very large image-side numerical aperture secured, and to well correct for the off-axis aberrations in the still exposure region of the projection optical system PL set in the size of about a half of the shot-area, without causing an increase in the size of lenses.

Although the first example adopts the configuration wherein the interior of the optical path between the projection optical system PL and the wafer W is filled with the medium (deionized water) Lm in order to achieve the large image-side numerical aperture, the execution of the still projection exposures prevents a drop of throughput due to the intervention of the medium Lm, different from the case of scanning exposure. In this manner, the first example enables the high-resolution projection exposure with high throughput, while securing the large effective image-side numerical aperture (NA=1.04) through the intervention of the high-refractive-index medium Lm in the optical path between the projection optical system PL and the wafer (photosensitive substrate) W, using the dioptric projection optical system PL easy to manufacture and the reticle (mask) of the ordinary size.

SECOND EXAMPLE

Figure 6:
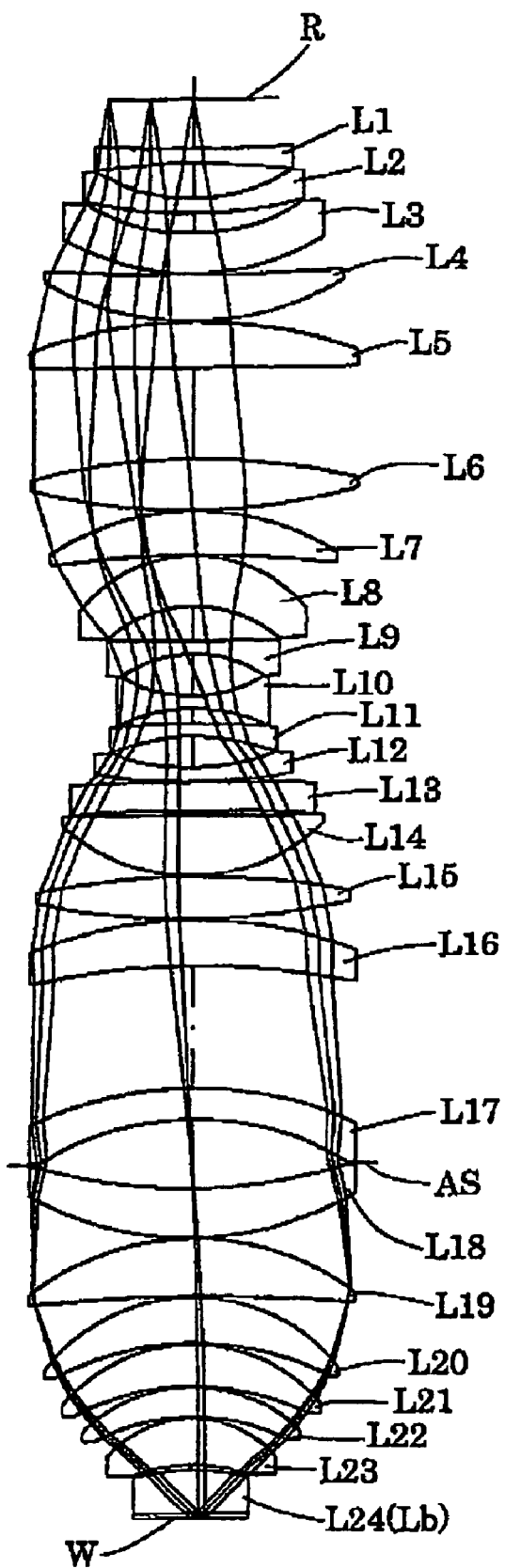
FIG. 6 is an illustration showing a lens configuration of a projection optical system according to the second example of the embodiment of the present invention.

FIG. 6 is an illustration showing a lens configuration of a projection optical system according to the second example of the present embodiment. With reference to FIG. 6, the projection optical system PL of the second example is composed of the following components arranged in order from the reticle side: a biconcave lens L1 whose concave surface of aspherical shape is kept toward the wafer, a negative meniscus lens L2 whose concave surface is kept toward the reticle; a negative meniscus lens L3 whose concave surface of aspherical shape is kept toward the reticle; a positive meniscus lens L4 whose concave surface is kept toward the reticle; a biconvex lens L5; a biconvex lens L6; a positive meniscus lens L7 whose convex surface is kept toward the reticle; a negative meniscus lens L8 whose convex surface is kept toward the reticle; a biconcave lens L9; a biconcave lens L10 whose concave surface of aspherical shape is kept toward the reticle; a negative meniscus lens L11 whose concave surface of aspherical shape is kept toward the wafer; a negative meniscus lens L12 whose convex surface of aspherical shape is kept toward the wafer; a lens L13 whose aspherical surface is kept toward the wafer, a biconvex lens L14; a biconvex lens L15; a positive meniscus lens L16 whose convex surface is kept toward the reticle; a negative meniscus lens L17 whose convex surface is kept toward the reticle; an aperture stop AS; a positive meniscus lens L18 whose concave surface is kept toward the reticle; a positive meniscus lens L19 whose convex surface is kept toward the reticle; a positive meniscus lens L20 whose convex surface is kept toward the reticle; a positive meniscus lens L21 whose convex surface is kept toward the reticle; a positive meniscus lens L22 whose concave surface of aspherical shape is kept toward the wafer; a positive meniscus lens L23 whose convex surface is kept toward the reticle; and a planoconvex lens L24 (boundary lens Lb) whose plane is kept toward the wafer.

In the second example, the optical path between the planoconvex lens L24 as boundary lens Lb and the wafer W is also filled with the medium Lm consisting of deionized water, as in the fist example. The lenses L23 and L24 (Lb) are made of fluorite and the other lens components of silica. Table (2) below presents values of specifications of the projection optical system PL in the second example.

TABLE 2

(Principal Specifications)

$\lambda = 193.306$ nm
$\beta = \frac{1}{6}$
NA = 1.04

(Specifications of Optical Members)

| Surface No. | r | d | n | Optical Member |
|---|---|---|---|---|
|  | (reticle surface) | 47.2707 |  |  |
| 1 | −2113.36467 | 13.0000 | 1.5603261 | (L1) |
| 2* | 453.80493 | 34.2999 |  |  |
| 3 | −183.05458 | 13.5596 | 1.5603261 | (L2) |
| 4 | −498.57068 | 19.1820 |  |  |
| 5* | −224.47445 | 40.1102 | 1.5603261 | (L3) |
| 6 | −252.37377 | 1.3804 |  |  |
| 7 | −2482.25164 | 46.0049 | 1.5603261 | (L4) |
| 8 | −298.62907 | 1.1690 |  |  |
| 9 | 471.69491 | 44.6807 | 1.5603261 | (L5) |
| 10 | −31743139.73000 | 91.3559 |  |  |
| 11 | 673.69002 | 51.1596 | 1.5603261 | (L6) |
| 12 | −629.89472 | 1.0000 |  |  |
| 13 | 258.97666 | 43.9714 | 1.5603261 | (L7) |

TABLE 2-continued

| | | | |
|---|---|---|---|
| 14 | 1044.16957 | 1.0000 | |
| 15 | 143.74217 | 49.9057 | 1.5603261 (L8) |
| 16 | 126.47115 | 34.6446 | |
| 17 | −4185.00862 | 13.0000 | 1.5603261 (L9) |
| 18 | 119.65456 | 42.1278 | |
| 19* | −141.50576 | 13.0000 | 1.5603261 (L10) |
| 20 | 163.61683 | 14.7204 | |
| 21 | 747.90268 | 13.0000 | 1.5603261 (L11) |
| 22* | 185.93581 | 31.3578 | |
| 23 | −220.25186 | 13.0000 | 1.5603261 (L12) |
| 24* | −1447.38747 | 1.0000 | |
| 25 | 3886.00092 | 29.0911 | 1.5603261 (L13) |
| 26* | −3899.69972 | 3.8815 | |
| 27 | 11621.97300 | 60.6998 | 1.5603261 (L14) |
| 28 | −189.52544 | 1.0000 | |
| 29 | 787.98551 | 42.7936 | 1.5603261 (L15) |
| 30 | −729.02232 | 1.0000 | |
| 31 | 420.22013 | 46.9283 | 1.5603261 (L16) |
| 32 | 743.02810 | 123.0280 | |
| 33 | 385.23841 | 30.6684 | 1.5603261 (L17) |
| 34 | 288.21816 | 45.4500 | |
| 35 | ∞ | 24.1471 | (AS) |
| 36 | −530.32540 | 49.8350 | 1.5603261 (L18) |
| 37 | −328.54592 | 1.0000 | |
| 38 | 271.23066 | 56.3549 | 1.5603261 (L19) |
| 39 | 1727.76502 | 1.0000 | |
| 40 | 186.72604 | 45.7017 | 1.5603261 (L20) |
| 41 | 296.60081 | 1.0009 | |
| 42 | 166.42204 | 41.6625 | 1.5603261 (L21) |
| 43 | 241.72697 | 1.0000 | |
| 44 | 152.34470 | 30.6247 | 1.5603261 (L22) |
| 45* | 231.02425 | 1.0000 | |
| 46 | 109.20982 | 47.6887 | 1.5014548 (L23) |
| 47 | 174.22298 | 4.7844 | |
| 48 | 233.15627 | 43.6470 | 1.5014548 (L24:Lb) |
| 49 | ∞ | 5.0000 | 1.47 (Lm) |
| (wafer surface) | | | |

(Aspherical Data)

Figure 7:
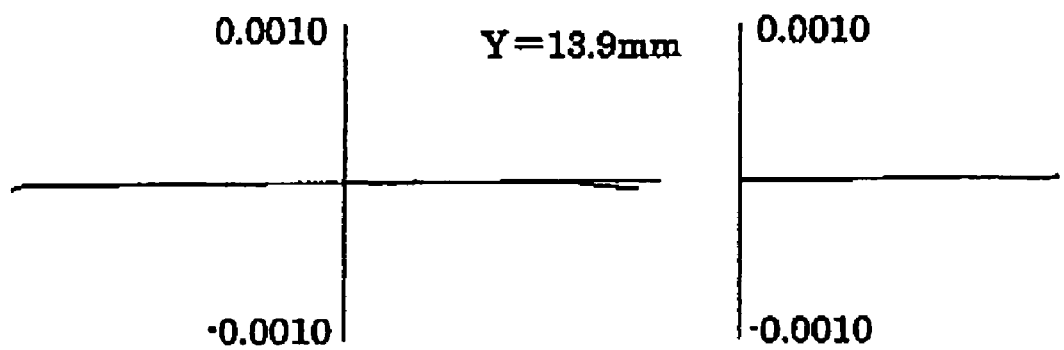
FIG. 7 is an illustration showing the transverse aberration in the second example.
Figure 7:
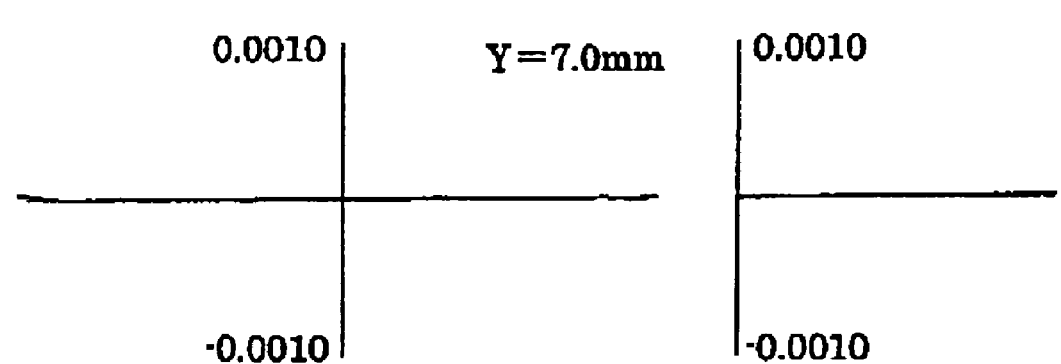
Figure 7:
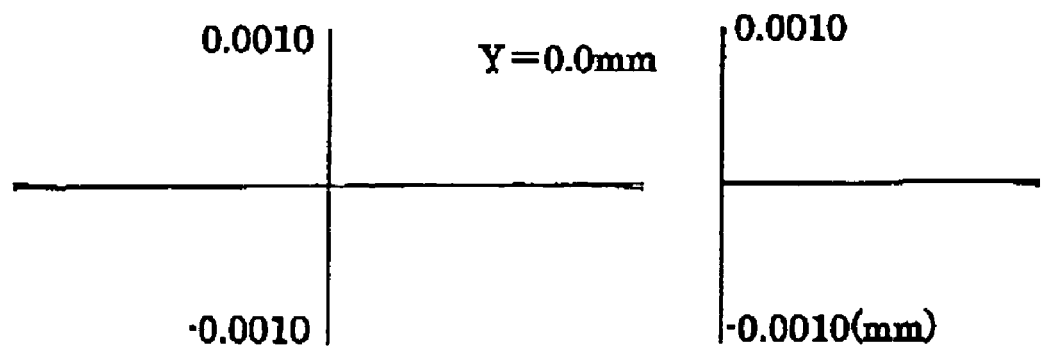

2nd surface $\kappa = 0$
$C_4 = -5.89398 \times 10^{-8}$   $C_6 = 1.73443 \times 10^{-12}$
$C_8 = 5.24472 \times 10^{-18}$   $C_{10} = -3.86522 \times 10^{-21}$
$C_{12} = 7.05506 \times 10^{-25}$   $C_{14} = -2.32807 \times 10^{-29}$ 5th surface $\kappa = 0$
$C_4 = -1.41390 \times 10^{-8}$   $C_6 = -3.41325 \times 10^{-13}$
$C_8 = -3.73007 \times 10^{-18}$   $C_{10} = -5.71351 \times 10^{-23}$
$C_{12} = -1.48547 \times 10^{-26}$   $C_{14} = 3.67043 \times 10^{-30}$ 19th surface $\kappa = 0$
$C_4 = -5.54786 \times 10^{-8}$   $C_6 = -1.36370 \times 10^{-11}$
$C_8 = 3.41049 \times 10^{-15}$   $C_{10} = -5.24079 \times 10^{-19}$
$C_{12} = 5.15555 \times 10^{-23}$   $C_{14} = -2.51676 \times 10^{-27}$ 22nd surface $\kappa = 0$
$C_4 = -4.44688 \times 10^{-8}$   $C_6 = -1.46963 \times 10^{-11}$
$C_8 = 2.74206 \times 10^{-15}$   $C_{10} = -3.33399 \times 10^{-19}$
$C_{12} = 2.40025 \times 10^{-23}$   $C_{14} = -8.47472 \times 10^{-28}$ 24th surface $\kappa = 0$
$C_4 = -6.38951 \times 10^{-8}$   $C_6 = 2.40146 \times 10^{-12}$
$C_8 = -9.96223 \times 10^{-17}$   $C_{10} = 1.94408 \times 10^{-21}$
$C_{12} = 2.46624 \times 10^{-29}$   $C_{14} = -1.17831 \times 10^{-29}$ 26th surface $\kappa = 0$
$C_4 = 4.30094 \times 10^{-8}$   $C_6 = -8.90706 \times 10^{-13}$
$C_8 = -5.70322 \times 10^{-17}$   $C_{10} = 4.02240 \times 10^{-21}$
$C_{12} = -1.06448 \times 10^{-25}$   $C_{14} = 1.21494 \times 10^{-30}$ TABLE 2-continued 45th surface κ = 0
$C_4 = 3.18085 \times 10^{-8}$         $C_6 = 2.25264 \times 10^{-13}$
$C_8 = 1.50272 \times 10^{-17}$        $C_{10} = 9.64684 \times 10^{-22}$
$C_{12} = -4.26869 \times 10^{-26}$    $C_{14} = 3.72942 \times 10^{-30}$ FIG. 7 is an illustration showing the transverse aberration in the second example. In the aberration diagram, Y indicates the image height. As apparent from the aberration diagram of FIG. 7, the aberration is well corrected for in the image circle with the radius of 13.9 mm in the second example, though the very large image-side numerical aperture (NA=1.04) is secured through the use of the ArF excimer laser light in the dioptric projection optical system with the projection magnification of ⅙.

Figure 8:
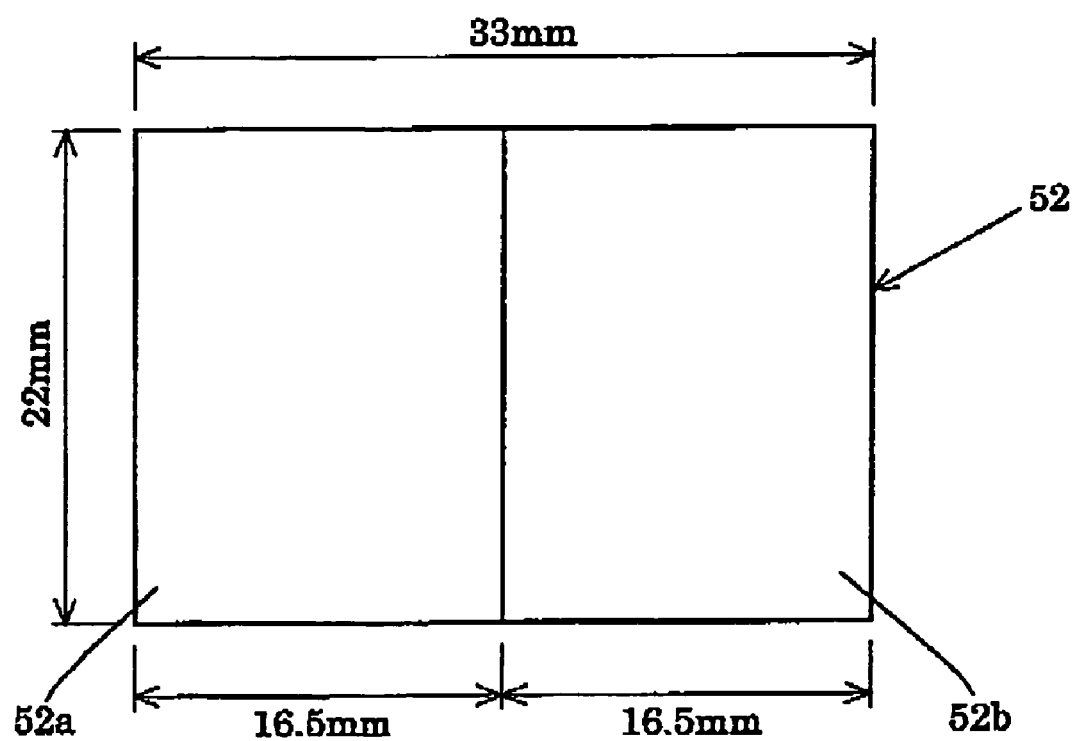
FIG. 8 is an illustration showing the relationship between a shot-area and partial exposure regions in the second example.

FIG. 8 is an illustration showing the relationship between a shot-area and partial exposure regions in the second example. In the second example, as shown in FIG. 8, the shot-area 52 of 33 mm×22 mm is divided into two partial exposure regions 52a and 52b having the size of 22 mm×16.5 mm. Here each of the partial exposure regions 52a and 52b is set in the size included in the image circle with the radius of 13.9 mm. In passing, the shot-area 52 has the size not included in the image circle with the radius of 13.9 mm.

In the second example, a still projection exposure is carried out in the first partial exposure region 52a with the size of a half of the shot-area 52, using the first reticle R1 of 6-inch size. Next, the first reticle R1 is replaced with the second reticle R2 of 6-inch size. Finally, a still projection exposure is performed in the second partial exposure region 52b having the size of a half of the shot-area 52, using the second reticle R2. Since in the second example the projection magnification of the projection optical system PL is set at ⅙ smaller than ordinary ¼, it is feasible to keep the object-side numerical aperture at a small level in spite of the very large image-side numerical aperture secured, and to well correct for the off-axis aberrations in the still exposure region of the projection optical system PL set in the size of about a half of the shot-area, without causing an increase in the size of lenses.

Although the present example adopts the configuration wherein the interior of the optical path between the projection optical system PL and the wafer W is filled with the medium (deionized water) Lm in order to achieve the large image-side numerical aperture, the execution of the still projection exposures prevents a drop of throughput due to the intervention of the medium Lm, different from the case of scanning exposure. In this manner, just as the first example, the second example also enables the high-resolution projection exposure with high throughput, while securing the large effective image-side numerical aperture (NA=1.04) through the intervention of the high-refractive-index medium Lm in the optical path between the projection optical system PL and the wafer (photosensitive substrate) W, using the dioptric projection optical system PL easy to manufacture and the reticle (mask) of the ordinary size.

THIRD EXAMPLE

Figure 9:
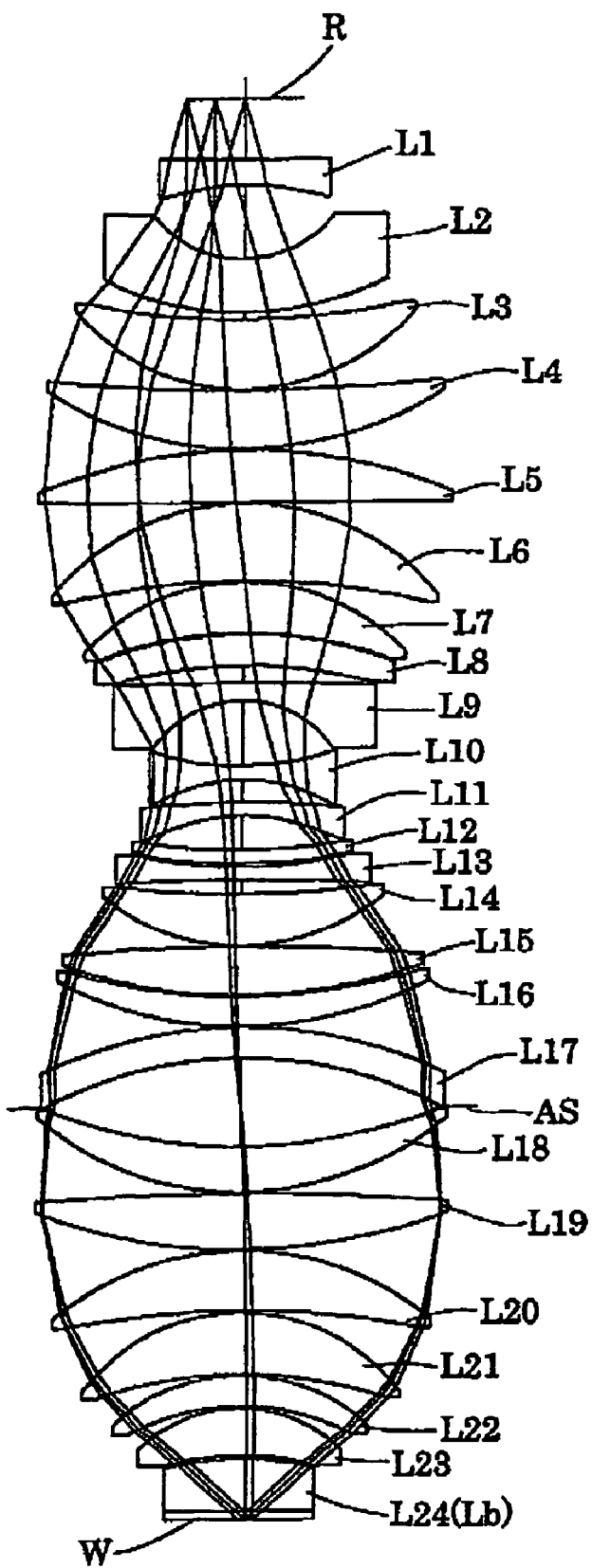
FIG. 9 is an illustration showing a lens configuration of a projection optical system according to the third example of the embodiment of the present invention.

FIG. 9 is an illustration showing a lens configuration of a projection optical system according to the third example of the present embodiment. With reference to FIG. 9, the projection optical system PL of the third example is composed of the following components arranged in order from the reticle side: a biconcave lens L1 whose concave surface of aspherical shape is kept toward the wafer; a negative meniscus lens L2 whose concave surface is kept toward the reticle; a positive meniscus lens L3 whose concave surface of aspherical shape is kept toward the reticle; a positive meniscus lens L4 whose concave surface is kept toward the reticle; a biconvex lens L5; a positive meniscus lens L6 whose convex surface is kept toward the reticle; a positive meniscus lens L7 whose convex surface is kept toward the reticle; a positive meniscus lens L8 whose convex surface is kept toward the reticle; a negative meniscus lens L9 whose convex surface is kept toward the reticle; a biconcave lens L10 whose concave surface of aspherical shape is kept toward the reticle; a negative meniscus lens L11 whose concave surface of aspherical shape is kept toward the wafer, a negative meniscus lens L12 whose convex surface of aspherical shape is kept toward the wafer; a lens L13 whose aspherical surface is kept toward the wafer, a positive meniscus lens L14 whose concave surface is kept toward the reticle; a biconvex lens L15; a positive meniscus lens L16 whose concave surface is kept toward the reticle; a negative meniscus lens L17 whose convex surface is kept toward the reticle; an aperture stop AS; a positive meniscus lens L18 whose concave surface is kept toward the reticle; a biconvex lens L19; a positive meniscus lens L20 whose convex surface is kept toward the reticle; a positive meniscus lens L21 whose convex surface is kept toward the reticle; a positive meniscus lens L22 whose concave surface of aspherical shape is kept toward the wafer; a positive meniscus lens L23 whose convex surface is kept toward the reticle; and a plano-convex lens L24 (boundary lens Lb) whose plane is kept toward the wafer.

In the third example, the optical path between the plano-convex lens L24 as boundary lens Lb and the wafer W is filled with the medium Lm consisting of deionized water, as in the second example. The lenses L23 and L24 (Lb) are made of fluorite and the other lens components of silica. Table (3) below presents values of specifications of the projection optical system PL in the third example.

TABLE 3

(Principal Specifications)

λ = 193.306 nm
β = ¼
NA = 1.1

(Specifications of Optical Members)

| Surface No. | r | d | n | Optical Member |
|---|---|---|---|---|
|  | (reticle surface) | 43.2299 |  |  |
| 1 | −1648.42444 | 18.0094 | 1.5603261 | (L1) |
| 2* | 155.60352 | 53.8656 |  |  |
| 3 | −83.24602 | 39.0000 | 1.5603261 | (L2) |
| 4 | −227.86941 | 5.0618 |  |  |
| 5* | −648.46217 | 51.9514 | 1.5603261 | (L3) |
| 6 | −160.79712 | 0.7800 |  |  |
| 7 | −1390.47797 | 42.8797 | 1.5603261 | (L4) |
| 8 | −268.83663 | 0.7800 |  |  |
| 9 | 393.44856 | 38.3388 | 1.5603261 | (L5) |
| 10 | −24759648.99000 | 0.7800 |  |  |
| 11 | 179.40000 | 57.9028 | 1.5603261 | (L6) |
| 12 | 552.98755 | 0.7800 |  |  |
| 13 | 158.85718 | 37.9382 | 1.5603261 | (L7) |
| 14 | 299.67353 | 0.7800 |  |  |
| 15 | 297.95802 | 23.1595 | 1.5603261 | (L8) |
| 16 | 352.47534 | 12.6443 |  |  |
| 17 | 2975.86728 | 13.5392 | 1.5603261 | (L9) |
| 18 | 79.22773 | 48.4560 |  |  |
| 19* | −273.10167 | 10.1400 | 1.5603261 | (L10) |
| 20 | 126.57803 | 16.4519 |  |  |

TABLE 3-continued

| | | | |
|---|---|---|---|
| 21 | 677.57406 | 10.1400 | 1.5603261 (L11) |
| 22* | 131.30097 | 24.8434 | |
| 23 | −459.77022 | 10.1400 | 1.5603261 (L12) |
| 24* | −565.00048 | 2.7674 | |
| 25 | −338.10100 | 10.1400 | 1.5603261 (L13) |
| 26* | −5887.54784 | 10.1771 | |
| 27 | −755.01102 | 38.8624 | 1.5603261 (L14) |
| 28 | −160.32668 | 0.7800 | |
| 29 | 1497.37271 | 36.1113 | 1.5603261 (L15) |
| 30 | −398.09699 | 0.7800 | |
| 31 | −453.07871 | 22.4186 | 1.5603261 (L16) |
| 32 | −290.48481 | 0.7800 | |
| 33 | 335.35995 | 23.2321 | 1.5603261 (L17) |
| 34 | 305.16493 | 37.0794 | |
| 35 | ∞ | 29.1138 | (AS) |
| 36 | −385.77568 | 33.7858 | 1.5603261 (L18) |
| 37 | −232.05704 | 0.7800 | |
| 38 | 1914.06318 | 41.6885 | 1.5603261 (L19) |
| 39 | −425.72085 | 0.7800 | |
| 40 | 217.78624 | 43.9321 | 1.5603261 (L20) |
| 41 | 693.39425 | 1.3503 | |
| 42 | 146.98824 | 45.1583 | 1.5603261 (L21) |
| 43 | 329.33948 | 0.7800 | |
| 44 | 137.45804 | 23.0812 | 1.5603261 (L22) |
| 45* | 163.78004 | 1.4036 | |
| 46 | 104.70600 | 35.6529 | 1.5014548 (L23) |
| 47 | 208.37760 | 2.3700 | |
| 48 | 218.94229 | 39.0000 | 1.5014548 (L24:Lb) |
| 49 | ∞ | 6.2400 | 1.47 (Lm) |
| (wafer surface) | | | |

(Aspherical Data)

Figure 10:
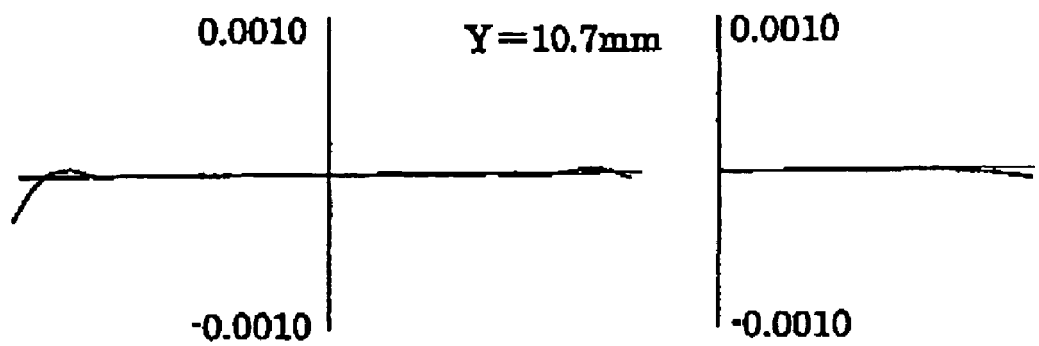
FIG. 10 is an illustration showing the transverse aberration in the third example.

2nd surface $\kappa = 0$
$C_4 = -2.87434 \times 10^{-7}$        $C_6 = 1.77862 \times 10^{-11}$
$C_8 = -1.51680 \times 10^{-15}$       $C_{10} = 1.76703 \times 10^{-19}$
$C_{12} = -1.12184 \times 10^{-23}$    $C_{14} = 5.77460 \times 10^{-28}$ 5th surface $\kappa = 0$
$C_4 = -1.73314 \times 10^{-8}$        $C_6 = 4.42971 \times 10^{-13}$
$C_8 = -8.97627 \times 10^{-18}$       $C_{10} = 4.37986 \times 10^{-22}$
$C_{12} = -7.75307 \times 10^{-27}$    $C_{14} = 5.20902 \times 10^{-32}$ 19th surface $\kappa = 0$
$C_4 = -2.09048 \times 10^{-7}$        $C_6 = 1.52677 \times 10^{-11}$
$C_8 = -1.03276 \times 10^{-15}$       $C_{10} = -5.36272 \times 10^{-22}$
$C_{12} = 1.70058 \times 10^{-23}$     $C_{14} = -2.29651 \times 10^{-27}$ 22nd surface $\kappa = 0$
$C_4 = -1.23182 \times 10^{-7}$        $C_6 = 3.18273 \times 10^{-13}$
$C_8 = -8.98342 \times 10^{-16}$       $C_{10} = -1.89028 \times 10^{-20}$
$C_{12} = 1.25408 \times 10^{-23}$     $C_{14} = -1.36191 \times 10^{-27}$ 24th surface $\kappa = 0$
$C_4 = -6.70832 \times 10^{-8}$        $C_6 = 6.27068 \times 10^{-13}$
$C_8 = 3.22210 \times 10^{-17}$        $C_{10} = -2.68397 \times 10^{-20}$
$C_{12} = 3.03645 \times 10^{-24}$     $C_{14} = -2.93312 \times 10^{-28}$ 26th surface $\kappa = 0$
$C_4 = 8.42220 \times 10^{-8}$         $C_6 = -4.47676 \times 10^{-12}$
$C_8 = -2.88784 \times 10^{-16}$       $C_{10} = 3.66491 \times 10^{-20}$
$C_{12} = -1.87557 \times 10^{-24}$    $C_{14} = 2.37260 \times 10^{-29}$ 45th surface $\kappa = 0$
$C_4 = -4.71348 \times 10^{-8}$        $C_6 = 1.88759 \times 10^{-12}$
$C_8 = 1.21807 \times 10^{-16}$        $C_{10} = -1.16571 \times 10^{-20}$
$C_{12} = 5.85852 \times 10^{-25}$     $C_{14} = -1.02599 \times 10^{-30}$ FIG. 10 is an illustration showing the transverse aberration in the third example. In the aberration diagram, Y indicates the image height. As apparent from the aberration diagram of FIG. 10, the aberration is well corrected for in the image circle with the radius of 10.7 mm in the third example, though the very large image-side numerical aperture (NA=1.1) is secured through the use of the ArF excimer laser light in the dioptric projection optical system with the projection magnification of ¼.

Figure 11:
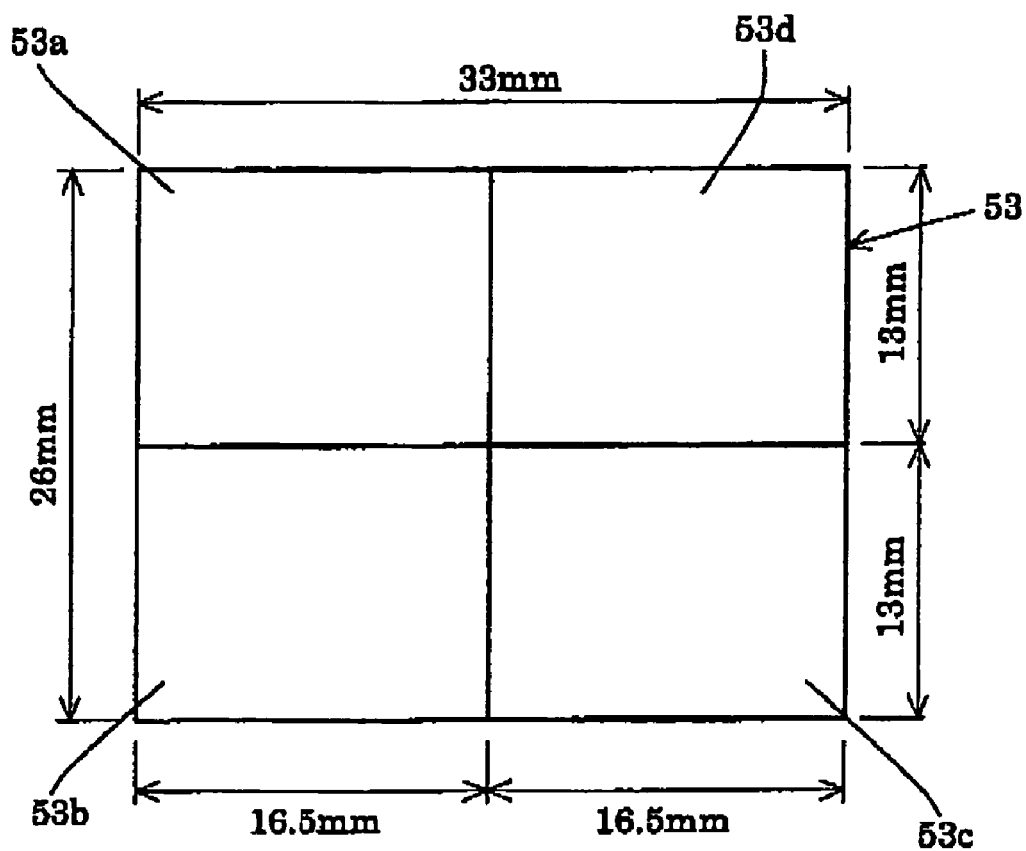
FIG. 11 is an illustration showing the relationship between a shot-area and partial exposure regions in the third example.

FIG. 11 is an illustration showing the relationship between a shot-area and partial exposure regions in the third example. In the third example, as shown in FIG. 11, the shot-area 53 of 33 mm×26 mm is divided into four partial exposure regions 53a, 53b, 53c, and 53d having the size of 16.5 mm×13 mm. Here each of the partial exposure regions 53a-53d is set in the size included in the image circle with the radius of 10.7 mm. In passing, the shot-area 53 has the size not included in the image circle with the radius of 10.7 mm.

In the third example, a still projection exposure is performed in the first partial exposure region 53a with the size of a quarter of the shot-area 53, using the first reticle R1 of 6-inch size. Next, the first reticle R1 is replaced with the second reticle R2 of 6-inch size, and a still projection exposure is performed in the second partial exposure region 53b having the size of a quarter of the shot-area 53, using the second reticle R2. Furthermore, the second reticle R2 is replaced with the third reticle R3 of 6-inch size and a still projection exposure is performed in the third partial exposure region 53c having the size of a quarter of the shot-area 53, using the third reticle R3. Finally, the third reticle R3 is replaced with the fourth reticle R4 of 6-inch size and a still projection exposure is performed in the fourth partial exposure region 53d having the size of a quarter of the shot-area 53, using the fourth reticle R4.

In the third example the projection magnification of the projection optical system PL is set at ordinary ¼, and the still exposure region of the projection optical system PL is set in the size of about a quarter of the shot-area; therefore, it is feasible to well correct for the off-axis aberrations in the still exposure region without causing an increase in the size of lenses, though the very large image-side numerical aperture is secured. Although the present example adopts the configuration wherein the interior of the optical path between the projection optical system PL and the wafer W is filled with the medium (deionized water) Lm in order to achieve the large image-side numerical aperture, the execution of the still projection exposures prevents a drop of throughput due to the intervention of the medium Lm, different from the case of scanning exposure. In this manner, just as the first example and the second example, the third example also enables the high-resolution projection exposure with high throughput, while securing the large effective image-side numerical aperture (NA=1.1) through the intervention of the high-refractive-index medium Lm in the optical path between the projection optical system PL and the wafer (photosensitive substrate) W, using the dioptric projection optical system PL easy to manufacture and the reticle (mask) of the ordinary size.

In each of the above-described examples one shot-area is equally divided into two or four partial exposure regions, but it is also possible to perform the so-called partly overlapping exposure in a state in which two partial exposure regions adjacent to each other overlap in part with each other. In each of the above-described examples one shot-area is divided into two or four partial exposure regions and one projection exposure is performed for each partial exposure region; however, it is also possible to perform double exposures for at least one partial exposure region.

In each of the above-described examples the still projection exposure is performed for each partial exposure region, but it is also possible to perform a scan exposure of a reticle pattern in each partial exposure region while moving the reticle and wafer relative to the projection optical system. In each of the above-described examples the projection exposure for each partial exposure region is performed using the dioptric projection optical system, but, without having to be limited to this, it is also possible to perform the projection exposure for each partial exposure region, for example, by use of a catadioptric projection optical system.

In the examples presented below, the medium Lm interposed between the boundary lens Lb and the wafer W is pure water having the refractive index of 1.43664 for the exposure light in the fourth example, and pure water having the refractive index of 1.43600 for the exposure light in the fifth example.

FOURTH EXAMPLE

Figure 12:
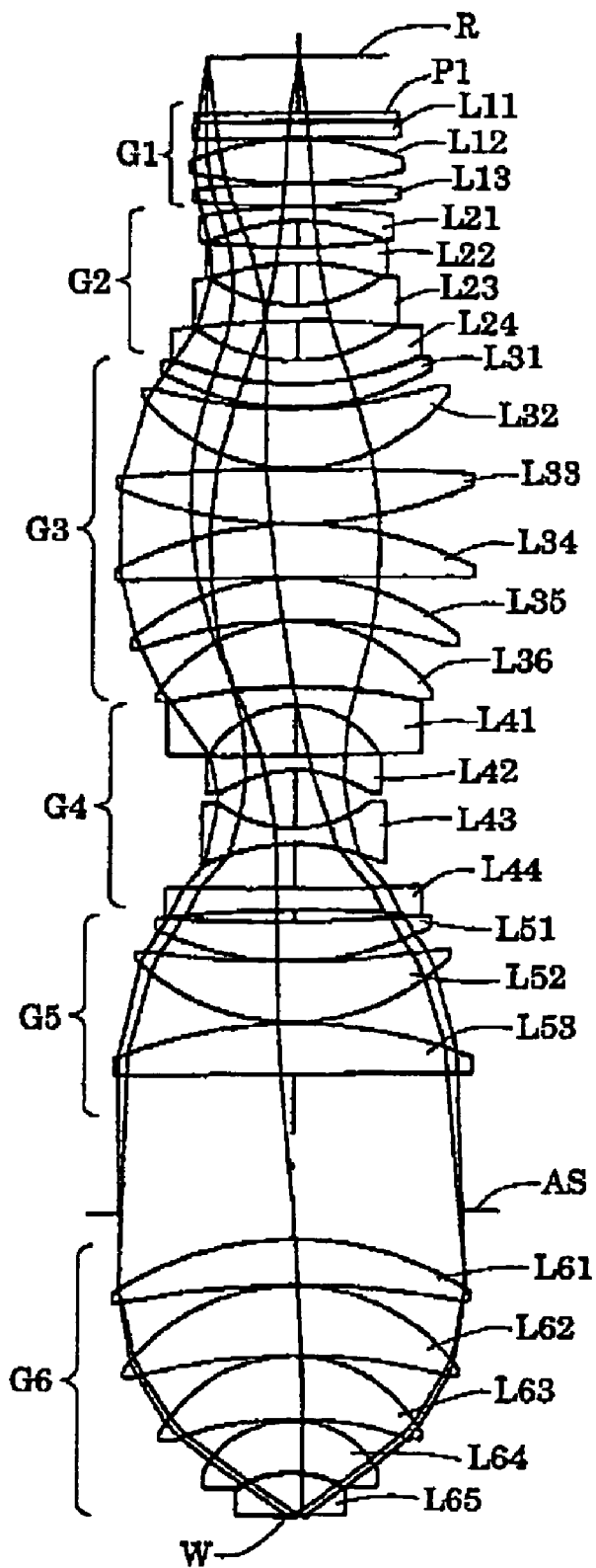
FIG. 12 is an illustration showing a lens configuration of a projection optical system according to the fourth example of the embodiment of the present invention.

FIG. 12 is an illustration showing a lens configuration of a projection optical system according to the fourth example of the present embodiment. With reference to FIG. 12, the projection optical system PL of the fourth example is composed of the following lens units arranged in order from the reticle side: a first lens unit G1 having a positive refracting power, a second lens unit G2 having a negative rating power; a third lens unit G3 having a positive refracting power; a fourth lens unit G4 having a negative refracting power; a fifth lens unit G5 having a positive refracting power, an aperture stop AS; and a sixth lens unit G6 having a positive refracting power.

The first lens unit G1 is composed of the following components arranged in order from the reticle side: a plane-parallel plate P1; a planoconcave lens L11 whose plane is kept toward the reticle; a biconvex lens L12; and a biconvex lens L13. The second lens unit G2 is composed of the following components arranged in order from the reticle side: a negative meniscus lens L21 whose concave surface of aspherical shape is kept toward the wafer; a biconcave lens L22; a biconcave lens L23; and a negative meniscus lens L24 whose concave surface is kept toward the reticle.

The third lens unit G3 is composed of the components arranged in order from the reticle side: a positive meniscus lens L31 whose concave surface of aspherical shape is kept toward the reticle; a positive meniscus lens L32 whose concave surface is kept toward the reticle; a biconvex lens L33; a positive meniscus lens L34 whose convex spice is kept toward the reticle; a positive meniscus lens L35 whose convex surface is kept toward the reticle; and a positive meniscus lens L36 whose concave surface of aspherical shape is kept toward the wafer. The fourth lens unit G4 is composed of the following components arranged in order from the reticle side: a negative meniscus lens L41 whose convex surface is kept toward the reticle; a biconcave lens L42 whose concave surface of aspherical shape is kept toward the wafer, a biconcave lens L43 whose concave surface of aspherical shape is kept toward the wafer; and a biconcave lens L44 whose concave surface of aspherical shape is kept toward the wafer.

The fifth lens unit G5 is composed of the following components arranged in order from the reticle side: a positive meniscus lens L51 whose concave surface is kept toward the reticle; a positive meniscus lens L52 whose concave surface is kept toward the reticle; and a biconvex lens L53. The sixth lens unit G6 is composed of the following components arranged in order from the reticle side a positive meniscus lens L61 whose convex surface is kept toward the reticle; a positive meniscus lens L62 whose convex surface is kept toward the reticle; a positive meniscus lens L63 whose concave surface of aspherical shape is kept toward the wafer, a positive meniscus lens L64 whose concave surface of aspherical shape is kept toward the wafer, and a planoconvex lens L65 (boundary lens Lb) whose plane is kept toward the wafer.

In the fourth example, the optical path between the planoconvex lens L65 as boundary lens Lb and the wafer W is filled with the medium Lm consisting of pure water. Only the planoconvex lens L65 is made of fluorite and the other lens components are made of silica.

Table (4) below presents values of specifications of the projection optical system PL in the fourth example. In Table (4), λ indicates the center wavelength of the exposure light, β the projection magnification (the imaging magnification of the entire system), NA the image-side (wafer-side) numerical aperture, and Ym the maximum image height. Each surface number represents an order of a surface from the reticle side, r a radius of curvature of each surface (in the case of an aspherical surface, a radius of curvature at the apex: mm), d an axial spacing or surface separation of each surface (mm), and n a refractive index for the center wavelength. The notations in Table (4) also apply to Table (5) hereinafter.

TABLE 4

(Principal Specifications)

λ = 193.306 nm
β = ⅛
NA = 1.2
Ym = 10.5 mm (Specifications of Optical Members)

| Surface No. | r | d | n | Optical Member |
|---|---|---|---|---|
| | (reticle surface) | 50.0000 | | |
| 1 | ∞ | 8.0000 | 1.5603261 | (P1) |
| 2 | ∞ | 1.0000 | | |
| 3 | ∞ | 14.0000 | 1.5603261 | (L11) |
| 4 | 5801.10144 | 1.0000 | | |
| 5 | 274.57869 | 39.8653 | 1.5603261 | (L12) |
| 6 | −459.16446 | 1.0000 | | |
| 7 | 1390.27385 | 20.0564 | 1.5603261 | (L13) |
| 8 | −868.62766 | 1.0000 | | |
| 9 | 465.65065 | 14.0000 | 1.5603261 | (L21) |
| 10* | 173.96720 | 24.0693 | | |
| 11 | −731.07113 | 14.0000 | 1.5603261 | (L22) |
| 12 | 235.12498 | 39.4555 | | |
| 13 | −141.54085 | 14.0000 | 1.5603261 | (L23) |
| 14 | 722.38474 | 37.8810 | | |
| 15 | −157.78699 | 21.8588 | 1.5603261 | (L24) |
| 16 | −280.56758 | 1.0000 | | |
| 17* | −326.76108 | 21.9918 | 1.5603261 | (L31) |
| 18 | −244.25456 | 1.0000 | | |
| 19 | −449.50039 | 56.4826 | 1.5603261 | (L32) |
| 20 | −183.11101 | 1.0000 | | |
| 21 | 2302.89247 | 51.2616 | 1.5603261 | (L33) |
| 22 | −411.55543 | 1.0000 | | |
| 23 | 371.46326 | 48.7816 | 1.5603261 | (L34) |
| 24 | 9503.36549 | 1.0000 | | |
| 25 | 235.11152 | 39.9014 | 1.5603261 | (L35) |
| 26 | 421.36614 | 1.0000 | | |
| 27 | 154.86823 | 61.6838 | 1.5603261 | (L36) |
| 28* | 465.72497 | 1.5047 | | |
| 29 | 501.43967 | 16.9978 | 1.5603261 | (L41) |
| 30 | 91.81381 | 47.4329 | | |
| 31 | −5363.84429 | 14.0000 | 1.5603261 | (L42) |
| 32* | 113.46256 | 54.7519 | | |
| 33 | −113.22450 | 14.0000 | 1.5603261 | (L43) |
| 34* | 171.05713 | 42.4704 | | |
| 35 | −2480.75152 | 20.3116 | 1.5603261 | (L44) |
| 36* | 1352.94197 | 10.7376 | | |
| 37 | −1754.53968 | 37.5345 | 1.5603261 | (L51) |
| 38 | −279.22390 | 1.0000 | | |
| 39 | −863.35259 | 57.3985 | 1.5603261 | (L52) |
| 40 | −209.74679 | 1.0000 | | |
| 41 | 441.49020 | 48.9491 | 1.5603261 | (L53) |
| 42 | −31363.74644 | 130.3080 | | |

TABLE 4-continued

| | | | |
|---|---|---|---|
| 43 | ∞ | 25.8952 | (AS) |
| 44 | 304.24875 | 43.3437 | 1.5603261 (L61) |
| 45 | 796.93838 | 1.0000 | |
| 46 | 197.10040 | 65.0278 | 1.5603261 (L62) |
| 47 | 539.90461 | 1.0000 | |
| 48 | 140.41439 | 59.2217 | 1.5603261 (L63) |
| 49* | 424.51849 | 1.0000 | |
| 50 | 92.87520 | 50.0000 | 1.5603261 (L64) |
| 51* | 106.82152 | 1.0000 | |
| 52 | 89.56390 | 40.9132 | 1.5014548 (L65:Lb) |
| 53 | ∞ | 3.0000 | 1.43664 (Lm) |
| (wafer surface) | | | |

(Aspherical Data)

10th surface $\kappa = 0$
$C_4 = -3.70154 \times 10^{-8}$      $C_6 = -7.54540 \times 10^{-13}$
$C_8 = -1.16366 \times 10^{-17}$     $C_{10} = 9.55608 \times 10^{-22}$
$C_{12} = -6.37962 \times 10^{-26}$  $C_{14} = 1.01247 \times 10^{-29}$ 17th surface $\kappa = 0$
$C_4 = -1.74641 \times 10^{-8}$      $C_6 = 1.67557 \times 10^{-13}$
$C_8 = -4.43667 \times 10^{-18}$     $C_{10} = 2.27983 \times 10^{-22}$
$C_{12} = -4.73178 \times 10^{-27}$  $C_{14} = 3.84644 \times 10^{-31}$ 28th surface $\kappa = 0$
$C_4 = -1.48540 \times 10^{-8}$      $C_6 = 1.37389 \times 10^{-12}$
$C_8 = -7.33575 \times 10^{-17}$     $C_{10} = 2.78286 \times 10^{-21}$
$C_{12} = -6.35060 \times 10^{-26}$  $C_{14} = 4.99896 \times 10^{-31}$ 32nd surface $\kappa = 0$
$C_4 = -9.75576 \times 10^{-8}$      $C_6 = -8.64616 \times 10^{-12}$
$C_8 = -1.88917 \times 10^{-16}$     $C_{10} = -4.12721 \times 10^{-20}$
$C_{12} = 2.39206 \times 10^{-24}$   $C_{14} = -1.23126 \times 10^{-27}$
$C_{16} = 4.51071 \times 10^{-32}$ 34th surface $\kappa = 0$
$C_4 = -6.26183 \times 10^{-8}$      $C_6 = -1.64882 \times 10^{-12}$
$C_8 = 4.65519 \times 10^{-17}$      $C_{10} = 1.00317 \times 10^{-20}$
$C_{12} = -6.91878 \times 10^{-25}$  $C_{14} = 7.21109 \times 10^{-30}$ 36th surface $\kappa = 0$
$C_4 = 8.44783 \times 10^{-9}$       $C_6 = -3.53948 \times 10^{-13}$
$C_8 = 2.80062 \times 10^{-18}$      $C_{10} = 5.31087 \times 10^{-23}$
$C_{12} = -5.69081 \times 10^{-27}$  $C_{14} = 2.11477 \times 10^{-32}$ 49th surface $\kappa = 0$
$C_4 = 4.19765 \times 10^{-8}$       $C_6 = -3.95821 \times 10^{-13}$
$C_8 = 1.25706 \times 10^{-17}$      $C_{10} = 9.21384 \times 10^{-22}$
$C_{12} = -4.77212 \times 10^{-26}$  $C_{14} = 1.73402 \times 10^{-30}$ 51st surface $\kappa = 0$
$C_4 = 1.41379 \times 10^{-7}$       $C_6 = 2.76603 \times 10^{-11}$
$C_8 = 1.95695 \times 10^{-15}$      $C_{10} = 2.49670 \times 10^{-19}$
$C_{12} = 8.01029 \times 10^{-23}$   $C_{14} = 5.62960 \times 10^{-27}$ (Values corresponding to Conditions)

L2 = 291.4 mm
LA = 1250 mm
P2 = 30.03 mm
PX = 326.5 mm
D4 = 141.13 mm
D0 = 168.0 mm
(1) L2/LA = 0.233
(2) P2/PX = 0.092
(3) D4/D0 = 0.840

Figure 13:
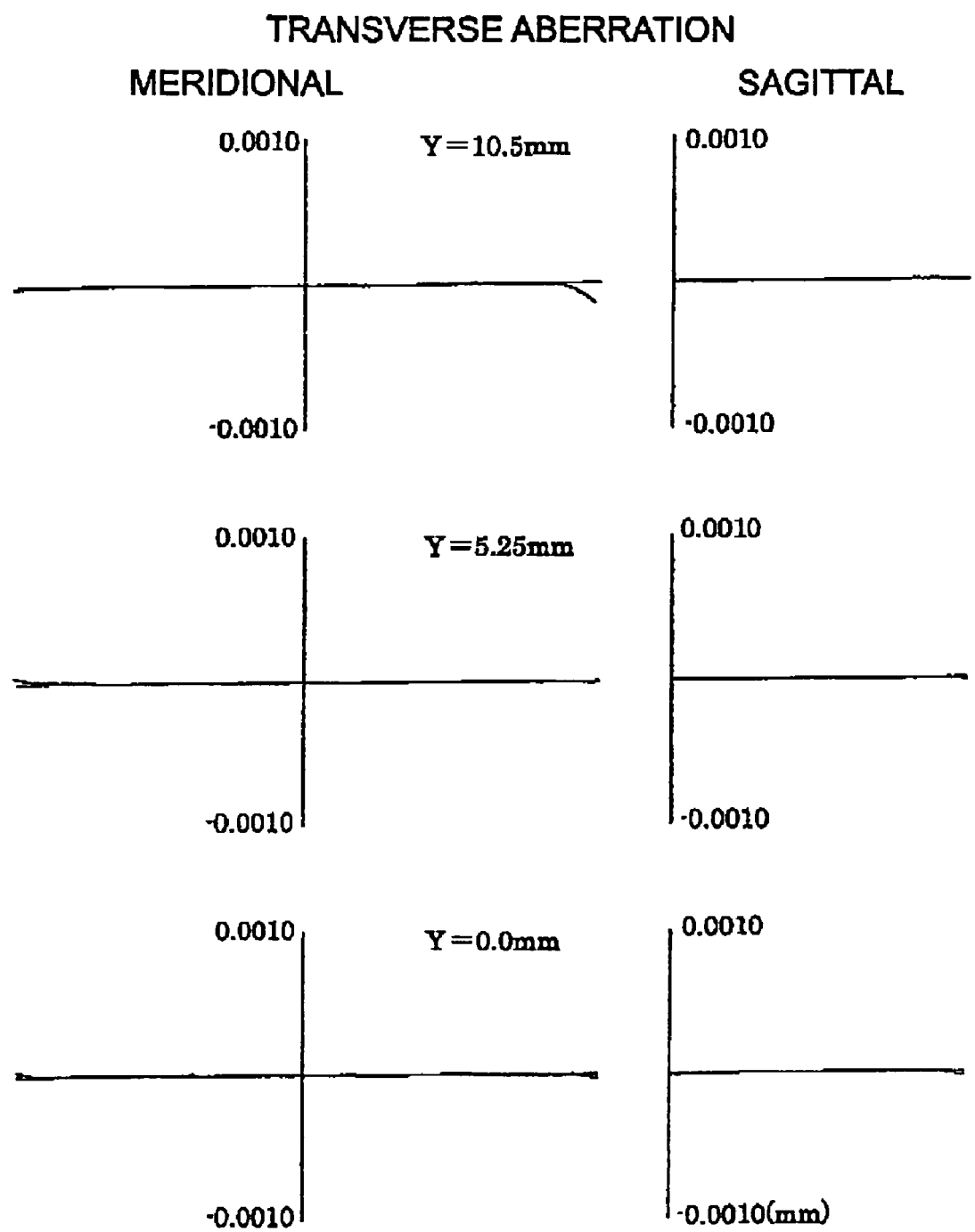
FIG. 13 is an illustration showing the transverse aberration in the fourth example.

FIG. 13 is a diagram showing the transverse aberration in the fourth example. In the aberration diagram, Y indicates the image height. As apparent from the aberration diagram of FIG. 13, the aberration on is well corrected for with the image circle with the radius (maximum image height) of 10.5 mm though the very large image-side numerical aperture (NA=1.2) is secured using the ArF excimer laser light in the dioptric projection optical system with the projection magnification of ⅛ in the fourth example.

FIFTH EXAMPLE

Figure 14:
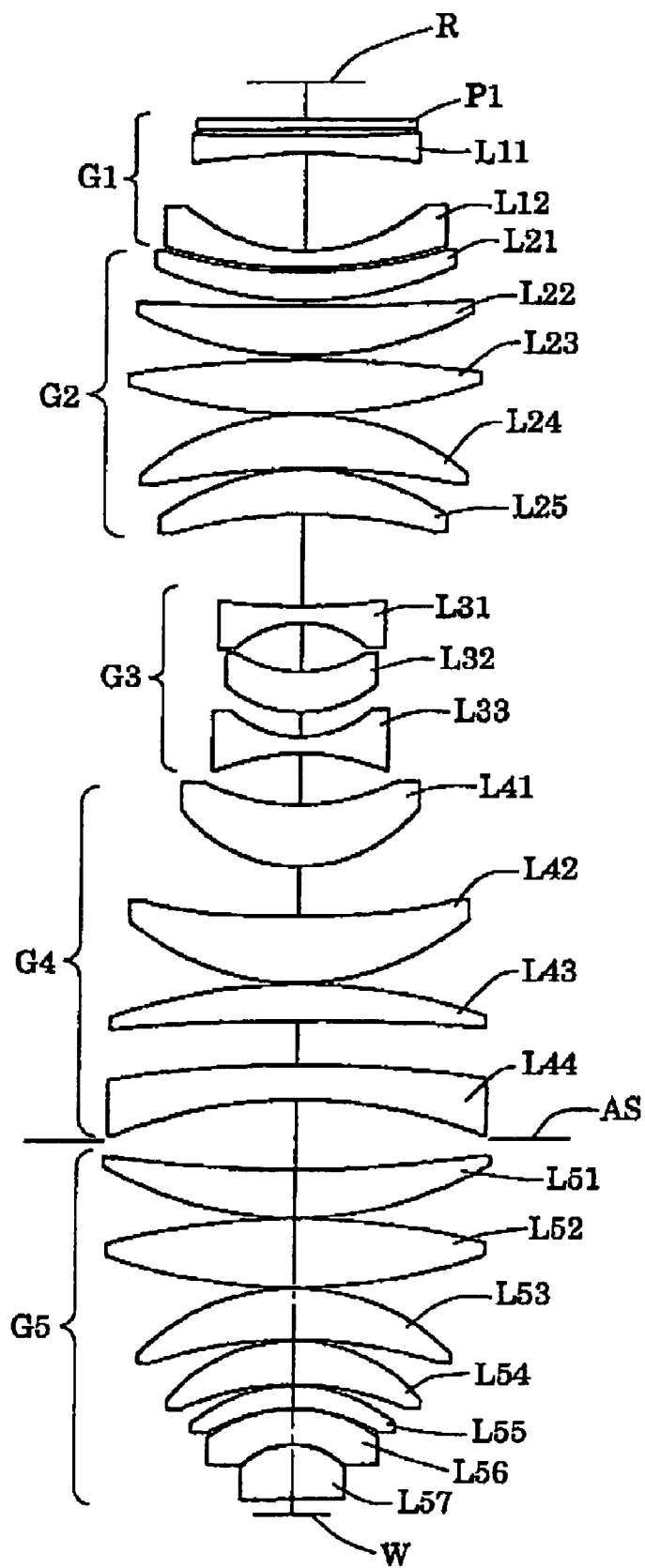
FIG. 14 is an illustration showing a lens configuration of a projection optical system according to the fifth example of the embodiment of the present invention.

FIG. 14 is an illustration showing a lens configuration of a projection optical system according to the fifth example of the present embodiment. With reference to FIG. 14, the projection optical system PL of the fifth example is composed of the following lens units arranged in order from the reticle side: a first lens unit G1 having a negative refracting power, a second lens unit G2 having a positive refracting power, a third lens unit G3 having a negative refracting power; a fourth lens unit G4 having a positive refracting power, an aperture stop AS; and a fifth lens unit G5 having a positive refracting power.

The first lens unit G1 is composed of the following components arranged in order from the reticle side: a plane-parallel plate P1; a biconcave lens L11 whose concave surface of aspherical shape is kept toward the wafer; and a negative meniscus lens L12 whose concave surface of aspherical shape is kept toward the reticle. The second lens unit G2 is composed of the following components arranged in order from the reticle side: a positive meniscus lens L21 whose concave surface is kept toward the reticle; a positive meniscus lens L22 whose concave surface is kept toward the reticle; a biconvex lens L23 whose convex surface of aspherical shape is kept toward the wafer; a positive meniscus lens L24 whose convex surface is kept toward the reticle; and a positive meniscus lens L25 whose convex surface is kept toward the reticle.

The third lens unit G3 is composed of the following components arranged in order from the reticle side: a biconcave lens L31; a negative meniscus lens L32 whose concave surface is kept toward the reticle; and a biconcave lens L33 whose concave surface of aspherical shape is kept toward the wafer. The fourth lens unit G4 is composed of the following components arranged in order from the reticle side: a positive meniscus lens L41 whose concave surface of aspherical shape is kept toward the reticle; a positive meniscus lens L42 whose concave surface of aspherical shape is kept toward the wafer; a positive meniscus lens L43 whose convex surface is kept toward the reticle; and a negative meniscus lens L44 whose convex surface is kept toward the reticle.

The fifth lens unit G5 is composed of the following components arranged in order from the reticle side: a positive meniscus lens L51 whose concave surface is kept toward the reticle; a biconvex lens L52; a positive meniscus lens L53 whose convex surface is kept toward the reticle; a positive meniscus lens L54 whose convex surface is kept toward the reticle; a negative meniscus lens L55 whose concave surface of aspherical shape is kept toward the wafer; a negative meniscus lens L56 whose convex surface is kept toward the reticle; and a planoconvex lens L57 (boundary lens Lb) whose plane is kept toward the wafer.

In the fifth example the optical path between the planoconvex lens L57 as boundary lens Lb and the wafer W is filled with the medium Lm consisting of pure water. Only the negative meniscus lens L56 and planoconvex lens L57 are made of fluorite and the other lens components of silica. Table (5) below presents values of specifications of the projection optical system PL in the fifth example.

TABLE 5

(Principal Specifications)

$\lambda$ = 193.306 nm
$\beta$ = 1/8
NA = 1.1
Ym = 10.5 mm (Specifications of Optical Members)

| Surface No. | r | d | n | Optical Member |
|---|---|---|---|---|
|  | (reticle surface) | 50.000 |  |  |
| 1 | ∞ | 8.000 | 1.5603261 | (P1) |
| 2 | ∞ | 5.852 |  |  |
| 3 | −2113.365 | 14.000 | 1.5603261 | (L11) |
| 4* | 392.563 | 82.347 |  |  |
| 5* | −153.929 | 14.585 | 1.5603261 | (L12) |
| 6 | −394.912 | 2.821 |  |  |
| 7 | −468.749 | 24.661 | 1.5603261 | (L21) |
| 8 | −303.970 | 4.731 |  |  |
| 9 | −2515.151 | 42.207 | 1.5603261 | (L22) |
| 10 | −309.040 | 3.752 |  |  |
| 11 | 912.984 | 47.173 | 1.5603261 | (L23) |
| 12* | −468.749 | 1.000 |  |  |
| 13 | 213.298 | 47.130 | 1.5603261 | (L24) |
| 14 | 621.048 | 1.000 |  |  |
| 15 | 207.549 | 39.109 | 1.5603261 | (L25) |
| 16 | 398.158 | 81.085 |  |  |
| 17 | −415.296 | 14.000 | 1.5603261 | (L31) |
| 18 | 85.260 | 42.810 |  |  |
| 19 | −102.120 | 35.159 | 1.5603261 | (L32) |
| 20 | −103.431 | 21.454 |  |  |
| 21 | −91.135 | 14.157 | 1.5603261 | (L33) |
| 22* | 165.940 | 44.380 |  |  |
| 23* | −193.036 | 53.016 | 1.5603261 | (L41) |
| 24 | −131.393 | 43.188 |  |  |
| 25* | −1536.216 | 60.000 | 1.5603261 | (L42) |
| 26 | −218.584 | 1.059 |  |  |
| 27 | 464.954 | 32.460 | 1.5603261 | (L43) |
| 28 | 1937.918 | 37.933 |  |  |
| 29 | 1041.991 | 29.971 | 1.5603261 | (L44) |
| 30 | 427.093 | 34.141 |  |  |
| 31 | ∞ | 27.275 |  | (AS) |
| 32 | −1066.707 | 42.356 | 1.5603261 | (L51) |
| 33 | −326.104 | 1.078 |  |  |
| 34 | 631.260 | 60.000 | 1.5603261 | (L52) |
| 35 | −489.634 | 1.000 |  |  |
| 36 | 187.612 | 44.290 | 1.5603261 | (L53) |
| 37 | 386.150 | 1.000 |  |  |
| 38 | 140.054 | 38.790 | 1.5603261 | (L54) |
| 39 | 236.715 | 1.000 |  |  |
| 40 | 134.236 | 19.527 | 1.5603261 | (L55) |
| 41* | 131.000 | 1.000 |  |  |
| 42 | 122.637 | 30.971 | 1.5014548 | (L56) |
| 43 | 63.462 | 1.022 |  |  |
| 44 | 62.543 | 46.511 | 1.5014548 | (L57:Lb) |
| 45 | ∞ | 1.000 | 1.43600 | (Lm) |
|  | (wafer surface) |  |  |  |

(Aspherical Data)

4th surface $\kappa$ = 0
$C_4$ = −6.87058 × 10$^{-8}$    $C_6$ = 1.98337 × 10$^{-12}$
$C_8$ = −2.33418 × 10$^{-17}$    $C_{10}$ = 4.28841 × 10$^{-21}$
$C_{12}$ = −1.88289 × 10$^{-25}$    $C_{14}$ = 1.05516 × 10$^{-29}$ 5th surface $\kappa$ = 0
$C_4$ = 8.21473 × 10$^{-9}$    $C_6$ = 5.90186 × 10$^{-13}$
$C_8$ = 2.81237 × 10$^{-17}$    $C_{10}$ = 1.57429 × 10$^{-21}$
$C_{12}$ = −1.01146 × 10$^{-25}$    $C_{14}$ = 4.09058 × 10$^{-30}$ 12th surface $\kappa$ = 0
$C_4$ = −1.35709 × 10$^{-8}$    $C_6$ = 1.56240 × 10$^{-15}$
$C_8$ = 9.48076 × 10$^{-19}$    $C_{10}$ = 5.36314 × 10$^{-22}$
$C_{12}$ = 0    $C_{14}$ = 0

TABLE 5-continued

22nd surface $\kappa$ = 0
$C_4$ = −8.62552 × 10$^{-8}$    $C_6$ = −3.31660 × 10$^{-12}$
$C_8$ = 3.60806 × 10$^{-16}$    $C_{10}$ = −2.06842 × 10$^{-20}$
$C_{12}$ = 4.96281 × 10$^{-25}$    $C_{14}$ = 4.51047 × 10$^{-31}$ 23rd surface $\kappa$ = 0
$C_4$ = −2.42730 × 10$^{-8}$    $C_6$ = −9.37917 × 10$^{-14}$
$C_8$ = 9.55217 × 10$^{-17}$    $C_{10}$ = 5.22545 × 10$^{-21}$
$C_{12}$ = 3.80044 × 10$^{-25}$    $C_{14}$ = 3.98450 × 10$^{-29}$ 25th surface $\kappa$ = 0
$C_4$ = −2.28538 × 10$^{-8}$    $C_6$ = 2.70616 × 10$^{-14}$
$C_8$ = −4.54050 × 10$^{-18}$    $C_{10}$ = −7.42942 × 10$^{-24}$
$C_{12}$ = −1.22807 × 10$^{-27}$    $C_{14}$ = −2.98334 × 10$^{-32}$ 41st surface $\kappa$ = 0
$C_4$ = −4.41623 × 10$^{-8}$    $C_6$ = −1.35429 × 10$^{-12}$
$C_8$ = 1.59382 × 10$^{-17}$    $C_{10}$ = −1.00707 × 10$^{-21}$
$C_{12}$ = −2.48318 × 10$^{-25}$    $C_{14}$ = −8.65436 × 10$^{-30}$ (Values corresponding to Conditions)

L2 = 289.5 mm
LA = 1250 mm
P3 = 56.91 mm
PX = 320.7 mm
D3 = 112.25 mm
D0 = 168.0 mm
(1) L2/LA = 0.232
(2) P3/PX = 0.177
(3) D3/D0 = 0.668

Figure 15:
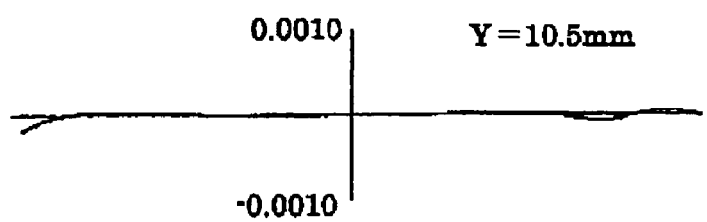
FIG. 15 is an illustration showing the transverse aberration in the fifth example.
Figure 15:
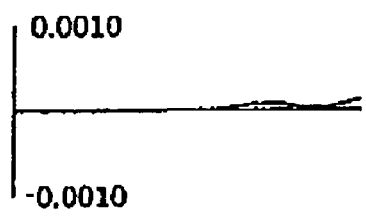
Figure 15:
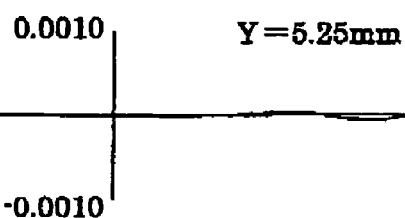
Figure 15:
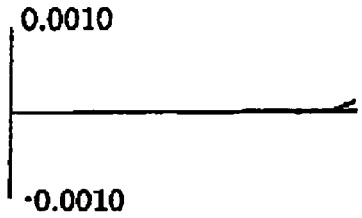
Figure 15:
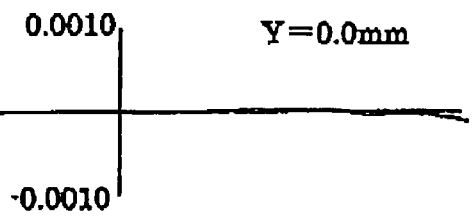
Figure 15:
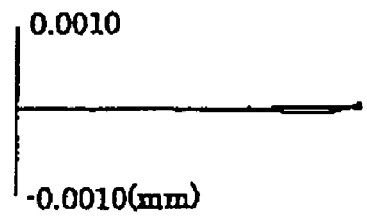

FIG. 15 is a diagram showing the transverse aberration in the fifth example. In the aberration diagram, Y indicates the image height. As apparent from the aberration diagram of FIG. 15, the aberration is well corrected for within the image circle with the radius (maximum image height) of 10.5 mm though the very large image-side numerical aperture (NA=1.1) is secured using the ArF excimer laser light in the dioptric projection optical system with the projection magnification of 1/8 in the fifth example, as in the fourth example.

Figure 16:
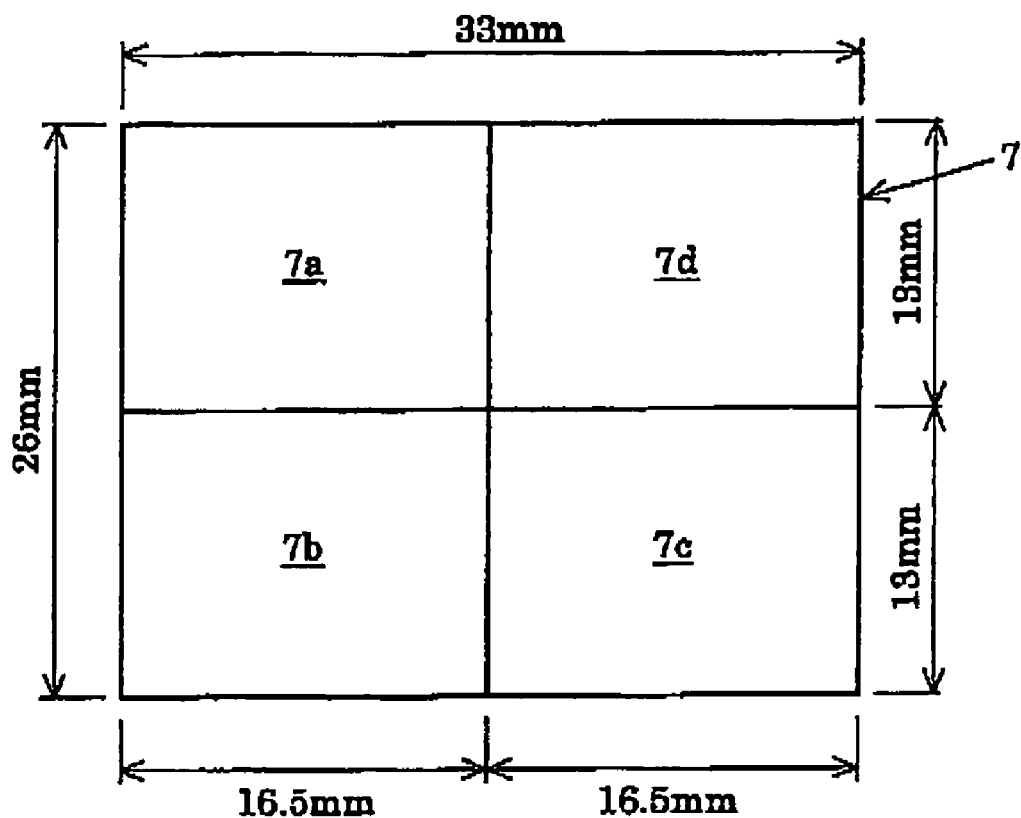
FIG. 16 is an illustration showing the relationship between a shot-area and partial exposure regions in the fourth example and the fifth example.
Figure 17A:
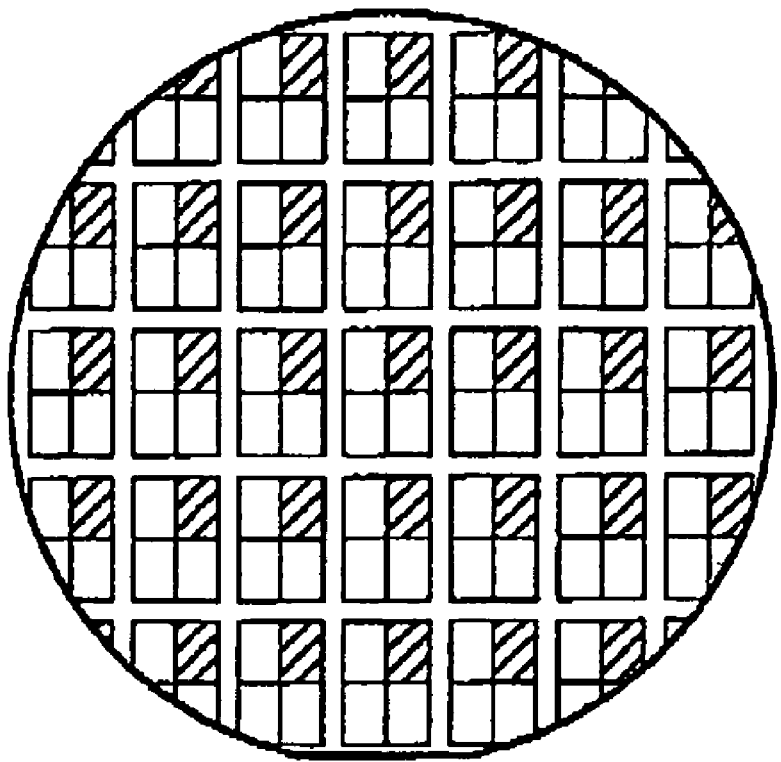
FIGS. 17A to 17D are illustrations showing an operation of repeatedly performing partial exposure steps for a plurality of shot-areas on one wafer in the fourth example and the fifth example.
Figure 17B:
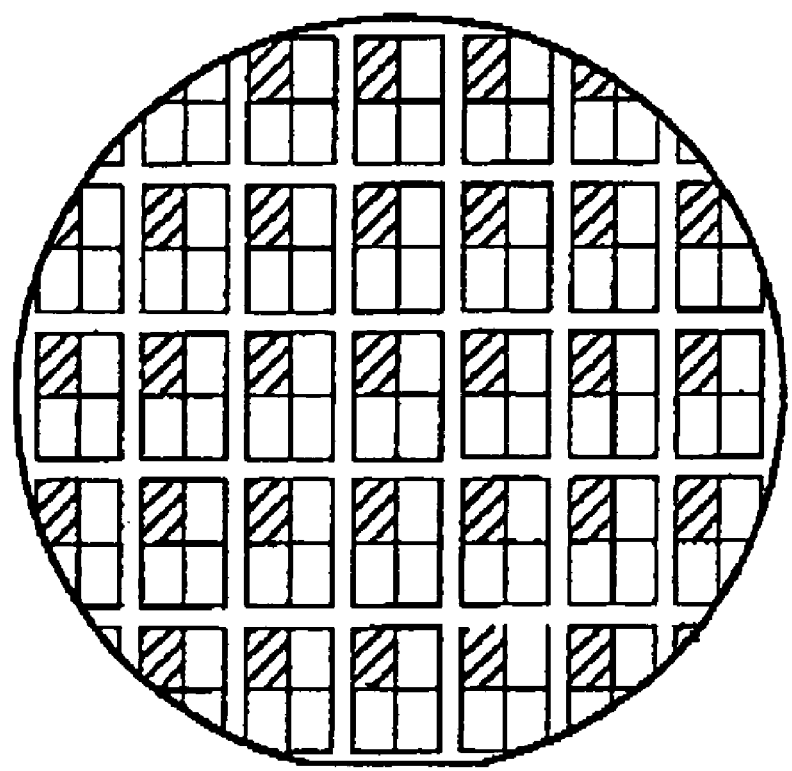
Figure 17C:
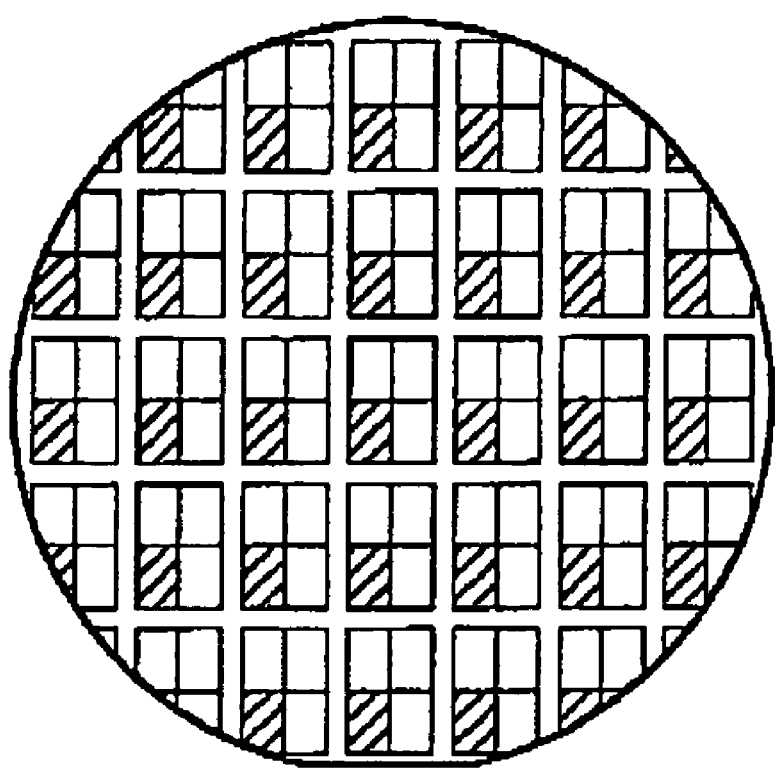
Figure 17D:
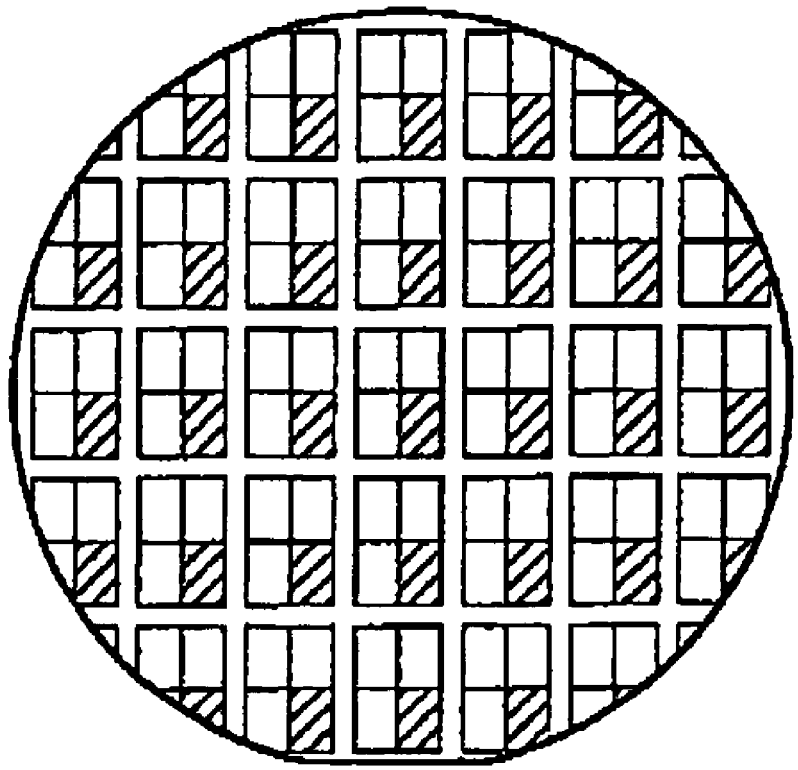

FIG. 16 is an illustration showing the relationship between a shot-area and partial exposure regions in the fourth and fifth examples. In the fourth and fifth examples, as shown in FIG. 16, a shot-area (corresponding to one chip) 7 of 33 mm×26 mm is divided into four partial exposure regions 7a, 7b, 7c, and 7d having the size of 16.5 mm×13 mm. Here each of the partial exposure regions 7a-7d is substantially included in the image circle with the radius of 10.5 mm.

In the fourth and fifth examples, a still projection exposure is performed in the first partial exposure region 7a having the size of a quarter of shot-area 7, using the first reticle R1 of 6-inch size. Then the first reticle R1 is replaced with the second reticle R2 of 6-inch size and a still projection exposure is performed in the second partial exposure region 7b having the size of a quarter of shot-area 7, using the second reticle R2. Furthermore, the second reticle R2 is replaced with the third reticle R3 of 6-inch size and a still projection exposure is performed in the third partial exposure region 7c having the size of a quarter of shot-area 7, using the third reticle R3. Finally, the third reticle R3 is replaced with the fourth reticle R4 of 6-inch size and a still projection exposure is performed in the fourth partial exposure region 7d having the size of a quarter of shot-area 7, using the fourth reticle R4.

In the fourth and fifth examples, the projection magnification of the projection optical system PL is set at 1/8 smaller than normal ¼ and the still exposure region of the projection optical system PL is set to the size of about a quarter of the shot-area; therefore, the object-side numerical aperture can be kept at a small level in spite of the very large image-side numerical aperture secured. As a result, it is feasible to well correct for the off-axis aberrations such as coma and, in turn, to secure the relatively large effective imaging area, without causing an increase in the size of lenses.

The above examples employ the configuration wherein the interior of the optical path between the projection optical system PL and the wafer W is filled with the medium (pure water) Lm in order to achieve the large image-side numerical aperture, but the execution of the still projection exposures prevents a drop of throughput due to the intervention of the medium Lm, different from the case of scanning exposure. In this manner, the fourth and fifth examples enable the high-resolution projection exposure with high throughput, while securing the large effective image-side numerical aperture (NA=1.2 or 1.1) through the intervention of the high-refractive-index medium Lm in the optical path between the projection optical system PL and the wafer (photosensitive substrate) W, using the dioptric projection optical system PL easy to manufacture and the reticle (mask) of the ordinary size.

The above description was given with focus on one shot-area 7 and a partial exposure step of performing a still projection exposure was repeated for the partial exposure regions 7a-7d thereof. In practice, however, partial exposure steps are repeated for a plurality of shot-areas on one wafer W. Specifically, as shown in FIGS. 17A to 17D, first partial exposure regions (hatched portions in FIG. 17A) in a plurality of shot-areas on a wafer W are successively exposed, the mask is replaced with another, and thereafter second partial exposure regions (hatched portions in FIG. 17B) in the plurality of shot-areas are successively exposed. Then the mask is replaced with another and thereafter third partial exposure regions (hatched portions in FIG. 17C) in the plurality of shot-areas are successively exposed. Furthermore, the mask is replaced with another and fourth partial exposure regions (hatched portions in FIG. 17D) in the plurality of shot-areas are successively exposed.

In the example of FIGS. 17A-17D, the second, third or fourth partial exposure regions are located between the plurality of first partial exposure regions in the plurality of shot-areas; i.e., the plurality of first partial exposure regions in the plurality of shot-areas are formed with a space (or the plurality of first partial exposure regions do not adjoin each other). Since the exposure regions formed by the previous exposure are located away from the exposure regions formed by the subsequent exposure as described above, it becomes feasible to avoid influence of beat or the like due to the previous exposure, in the subsequent exposure.

In the fourth and fifth examples described above, one shot-area is equally divided into four partial exposure regions, but it is also possible to perform the so-called partly overlapping exposure in a state in which two partial exposure regions adjacent to each other overlap in part with each other. On the above-described fourth and fifth examples, one shot-area is divided into four partial exposure regions and one projection exposure is carried out for each partial exposure region; however, it is also possible to perform double exposures for at least one partial exposure region. The above-described fourth and fifth examples involve performing the still projection exposure for each partial exposure region, but it is also possible to perform a scan exposure of a reticle pattern in each partial exposure region while moving the reticle and wafer relative to the projection optical system.

In the above-described fourth example, only the planoconvex lens L65 is made of fluorite, but the optical system is preferably constructed so as to include a pair of fluorite lenses, for example, by dividing the planoconvex lens L65 into two lenses or by forming the positive meniscus lens L64 of fluorite. In this configuration, influence of birefringence specific to fluorite can be reduced by properly setting the relation of orientations of crystal axes of the pair of fluorite lenses. For the technique of reducing the influence of birefringence specific to fluorite by properly setting the orientation relation of crystal axes of the pair of fluorite lenses, reference should be made, for example, to WO2003/007045 (or U.S. Published Patent Application US2003/0053036A) and others.

The exposure apparatus of the aforementioned embodiment can produce microdevices (semiconductor devices, image pickup devices, liquid-crystal display devices, thin-film magnetic heads, etc.) by illuminating the reticle (mask) by the illumination device (illumination step) and performing an exposure of a transcription pattern formed on the mask, onto the photosensitive substrate by the projection optical system (exposure step). An example of a method for producing semiconductor devices as microdevices by forming a predetermined circuit pattern on a wafer or the like as a photosensitive substrate by use of the exposure apparatus of the present embodiment will be described below with reference to the flowchart of FIG. 18.

Figure 18:
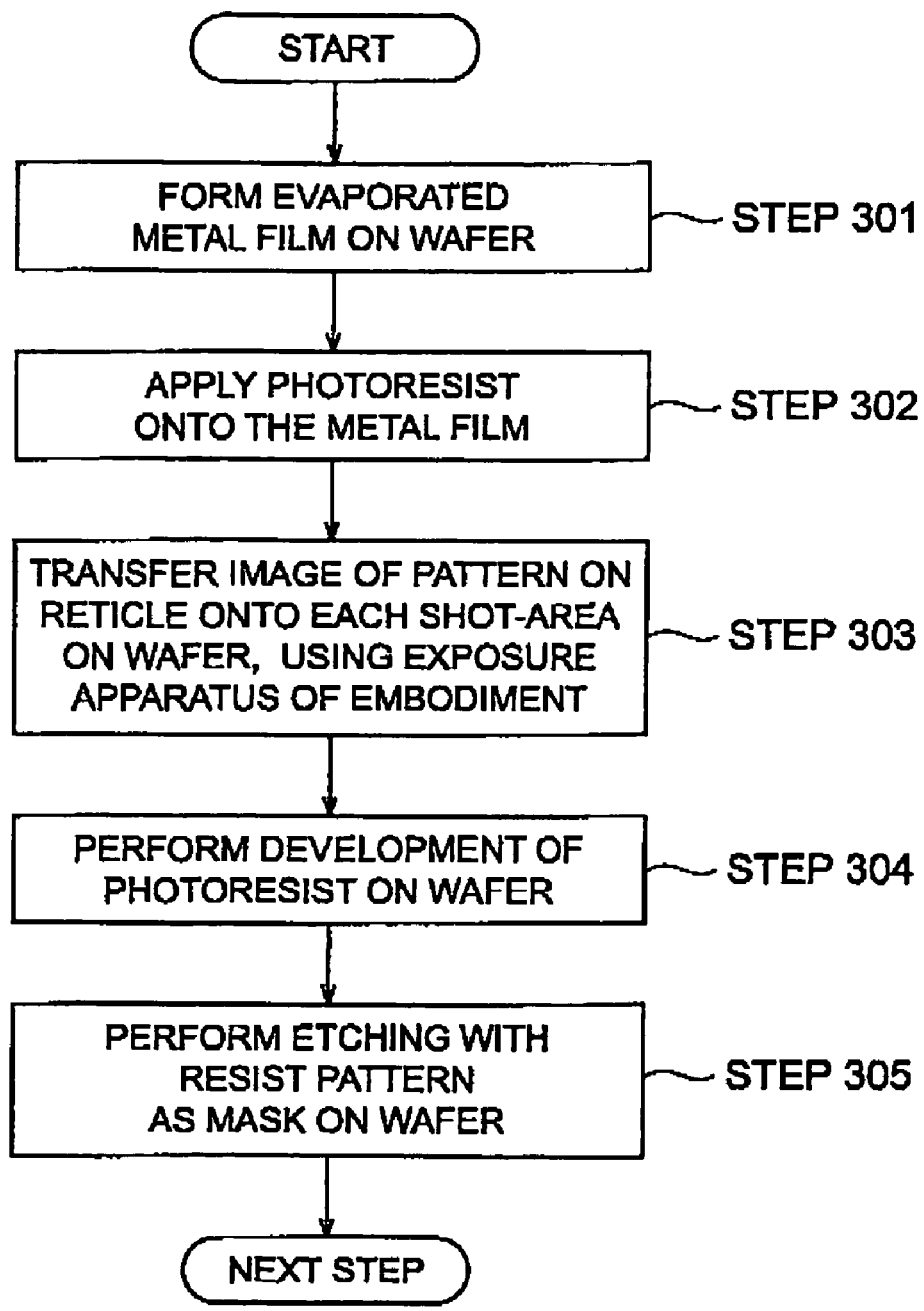
FIG. 18 is a flowchart of a method of producing semiconductor devices as microdevices.

First, step 301 in FIG. 18 is to form an evaporated metal film on each of wafers in one lot. Next step 302 is to apply a photoresist onto the metal film on each of the wafers in the lot. Thereafter, step 303 is to sequentially perform an exposure to transcribe an image of a pattern on a mask into each shot-area on each of the wafers in the lot through the projection optical system, using the exposure apparatus of the present embodiment. Step 304 thereafter is to perform development of the photoresist on each of the wafers in the lot, and next step 305 is to perform etching with the resist pattern as a mask on each of the wafers in the lot to form a circuit pattern corresponding to the pattern on the mask, in each shot-area on each wafer.

Thereafter, through formation of circuit patterns of upper layers and others, the devices such as semiconductor devices are produced. The semiconductor device production method described above permits us to obtain the semiconductor devices with an extremely fine circuit pattern at high throughput. Step 301 to step 305 are to perform the respective steps of evaporation of metal on the wafers, application of the resist onto the metal film, exposure, development, and etching, but it is needless to mention that the method may be so arranged that, prior to these steps, a silicon oxide film is formed on the wafer and thereafter the resist is applied onto the silicon oxide film, followed by the respective steps of exposure, development, etching, and so on.

The exposure apparatus of the present embodiment can also produce a liquid-crystal display device as a microdevice by forming predetermined patterns (circuit pattern, electrode pattern, etc.) on a plate (glass substrate). An example of a method of this production will be described below with reference to the flowchart of FIG. 19. In FIG. 19, pattern forming step 401 is to execute a so-called photolithography step of performing an exposure to transcribe a pattern of a mask onto a photosensitive substrate (a glass substrate coated with a resist or the like) by the exposure apparatus of the present embodiment. This photolithography step results in forming the predetermined pattern including a number of electrodes and others on the photosensitive substrate. Thereafter, the exposed substrate is processed through respective steps of development, etching, resist removal, and so on to form a predetermined pattern on the substrate, and is then transferred to next color filter forming step 402.

Next, the color filter forming step 402 is to form a color filter in a configuration wherein a number of sets of three dots corresponding to R (Red), G (Green), and B (Blue) are arrayed in a matrix, or in a configuration wherein a plurality of sets of filters of three stripes of R, G, and B are arranged in the direction of horizontal scan lines. After the color filter forming step 402, cell assembly step 403 is then executed. The cell assembly step 403 is to assemble a liquid crystal panel (liquid crystal cell), using the substrate with the predetermined pattern obtained in the pattern forming step 401, the color filter obtained in the color filter forming step 402, and so on. In the cell assembly step 403, for example, a liquid crystal is poured into the space between the substrate with the predetermined pattern obtained in the pattern forming step 401 and the color filter obtained in the color filter forming step 402, thereby producing a liquid crystal panel (liquid crystal cell).

Module assembly step 404 thereafter is to attach each of components such as an electric circuit, a backlight, etc. for display operation of the assembled liquid crystal panel (liquid crystal cell), thereby completing a liquid-crystal display device. The production method of the liquid-crystal display device described above permits liquid-crystal display devices with the extremely fine circuit pattern to be produced at high throughput.

The above embodiment uses the ArF excimer laser source, but, without having to be limited to this, it is also possible to use other appropriate light sources such as the $F_2$ laser source.

Since the present embodiment uses the ArF excimer laser light as the exposure light as described above, pure water is supplied as a liquid for liquid immersion exposure. Pure water is easily available in large quantity in semiconductor manufacturing facilities and others and has the advantage of no adverse effect on the photoresist on the substrate (wafer), the optical elements (lenses), and others. Since pure water has no adverse effect on environments and contains an extremely low amount of impurities, we can also expect the action of cleaning the surface of the substrate and the surface of the optical element located on the distal end surface of the projection optical system.

Pure water (water) is said to have the refractive index n of about 1.44 for the exposure light of the wavelength of approximately 193 nm. In the case where the ArF excimer laser light (wavelength 193 nm) is used as a light source of exposure light, the wavelength is reduced to 1/n, i.e., about 134 nm on the substrate to achieve high resolution. Furthermore, the depth of focus is increased to about n times or about 1.44 times that in air.

The liquid can be another liquid that is transparent to the exposure light, has the refractive index as high as possible, and is stable against the projection optical system and the photoresist on the surface of the substrate.

Where the $F_2$ laser light is used as the exposure light, the liquid can be a fluorinated liquid, for example, such as fluorinated oils and perfluorinated polyethers (PFPE), which can transmit the $F_2$ laser light.

The aforementioned embodiment adopts the configuration wherein the liquid is locally filled between the projection optical system PL and the substrate W, or the configuration wherein the liquid chamber in a predetermined depth is formed on the stage and wherein the substrate is held therein, but the present invention can also be applied to liquid immersion exposure apparatus arranged to move the stage holding the substrate to be exposed, in a liquid chamber. The structure and exposure operation of the liquid immersion exposure apparatus for moving the stage holding the substrate to be exposed, in the liquid chamber are disclosed, for example, in Japanese Patent Application Laid-Open No. 6-124873.

The present invention is also applicable to exposure apparatus of a twin stage type. The structure and exposure operation of the twin stage type exposure apparatus are disclosed, for example, in Japanese Patent Applications Laid-Open No. 10-163099 and No. 10-214783 (corresponding to U.S. Pat. Nos. 6,341,007, 6,400,441, 6,549,269, and 6,590,634), JP-A-2000-505958 (corresponding to U.S. Pat. No. 5,969,441), or U.S. Pat. Nos. 6,208,407. U.S. Pat. Nos. 6,341,007, 6,400, 441, 6,549,269, 6,590,634, 5,969,441, and 6,208,407 are each incorporated herein by reference in their entireties.

When the liquid immersion method is applied as described above, the numerical aperture NA of the projection optical system can be 0.9 to 1.3. In cases where the numerical aperture NA of the projection optical system is so large as described, use of randomly polarized light conventionally applied as the exposure light can degrade the imaging performance by virtue of its polarization effect, and it is thus desirable to use polarized illumination. A preferred configuration in those cases is such that linearly polarized illumination is effected in alignment with the longitudinal direction of line patterns of line-and-space patterns on the mask (reticle) so that the s-polarized component (TE polarization component), i.e., diffracted light in the polarization direction along the longitudinal direction of the line patterns is more emitted from the patterns of the mask (reticle). When the liquid fills the space between the projection optical system PL and the resist applied on the surface of the substrate W, the transmittance becomes higher on the resist surface for the diffracted light of the s-polarized component (TE polarization component) contributing to improvement in contrast than in the case where air (gas) fills the space between the projection optical system PL and the resist applied on the surface of the substrate W. For this reason, the high imaging performance can also be achieved even in the case where the numerical aperture NA of the projection optical system exceeds 1.0. It is more effective to use the phase shift mask, the oblique incidence illumination method (particularly, the dipole illumination) in alignment with the longitudinal direction of line patterns as disclosed in Japanese Patent Application Laid-Open No. 6-188169, etc. properly in combination.

Where fine line-and-space (L/S) patterns (e.g., L/S of about 25-50 nm) are transcribed onto the substrate W by use of the projection optical system PL with the reduction rate of about ¼ and the ArF excimer laser as exposure light, for example, as in the first to third examples, the mask M acts as a polarizer by the Wave guide effect, depending upon the structure of the mask M (e.g., minuteness of patterns and the thickness of chromium), and the diffracted light of the s-polarization component (TE polarization component) is more emitted from the mask than the diffracted light of the p-polarization component (TM polarization component) which degrades the contrast. In this case, it is also desirable to use the linearly polarized illumination as described above, but the randomly polarized light can also be used for illumination of the mask M to achieve the high resolution performance by use of the projection optical system having the large numerical aperture NA of 0.9-1.3.

In cases where extremely fine line-and-space patterns on the mask M are transcribed onto the substrate W, the p-polarization component (TM polarization component) can be greater than the s-polarization component (TE polarization component) by virtue of the Wire Grid effect, but the high resolution performance can also be achieved even in the case of the large numerical aperture NA of the projection optical system such as 0.9-1.3, because the diffracted light of the s-polarization component (TE polarization component) is more emitted from the mask than the diffracted light of the p-polarization component (TM polarization component), for example, under the conditions that the ArF excimer laser is used as the exposure light, the projection exposure system has the reduction rate of about ¼, and the line-and-space patterns greater than 25 mm are transcribed onto the substrate W.

Since the aforementioned fourth and fifth examples involve performing the exposure with the projection optical system having the projection magnification of not more than ⅛, they also have the advantage of reduced influence of the Wave guide effect and the Wire Grid effect due to the line-and-space patterns on the mask.

Furthermore, in addition to the linearly polarized illumination (s-polarized illumination) in alignment with the longitudinal direction of line patterns of the mask (reticle), it is also effective to adopt a combination of the polarized illumination using the linearly polarized light in the tangent (circumferential) direction of a circle with a center on the optical axis, with the obliquely incident illumination. Particularly, in cases where the patterns of the mask (reticle) include line patterns extending in a predetermined direction and line patterns extending in a plurality of different directions mixed, the high imaging performance can also be achieved even in the case of the large numerical aperture NA of the projection optical system, by combinationally using the polarized illumination using the linearly polarized light in the tangent direction of a circle with a center on the optical axis, and the annular illumination.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system for forming a reduced image of a first surface on a second surface, wherein
    an optical path between the projection optical system and the second surface is filled with a medium having a refractive index larger than 1.1 where a refractive index of an atmosphere in an optical path of the projection optical system is 1,
    every optical member having a power in the projection optical system is a transmitting optical member,
    a magnification of the projection optical system is not more than ⅛, and
    the projection optical system is substantially telecentric on both a first surface side and a second surface side of the projection optical system.

2. The projection optical system according to claim 1, satisfying the following condition:

$$0.18 < L2/LA < 0.245 \quad (1),$$

where L2 is a distance from a pupil position on the second surface side to the second surface and LA is a distance from the first surface to the second surface.

3. The projection optical system according to claim 2, comprising:
    at least one variable aperture stop disposed at or near the pupil position on the second surface side.

4. The projection optical system according to claim 2, comprising the following lens units arranged in order from the first surface side:

a first lens unit having a positive refracting power;
a second lens unit having a negative refracting power;
a third lens unit having a positive refracting power;
a fourth lens unit having a negative refracting power;
a fifth lens unit having a positive refracting power;
an aperture stop; and
a sixth lens unit having a positive refracting power;
wherein, where a size of a region occupied on each optical surface by a beam from a point on an optical axis of the first surface is defined as a partial diameter, the projection optical system satisfies the following condition:

$$0.04 < P2/PX < 0.2 \quad (2),$$

where PX is a maximum partial diameter in the projection optical system and P2 is a minimum partial diameter in the second lens unit.

5. The projection optical system according to claim 4, satisfying the following condition:

$$0.4 < D4/D0 < 0.9 \quad (3),$$

where D4 is a minimum clear aperture radius of a lens in the fourth lens unit and D0 is a clear aperture radius of the first surface.

6. The projection optical system according to claim 2, comprising the following lens units arranged in order from the first surface side:
    a first lens unit having a negative refracting power;
    a second lens unit having a positive refracting power;
    a third lens unit having a negative refracting power;
    a fourth lens unit having a positive refracting power;
    an aperture stop; and
    a fifth lens unit having a positive refracting power;
    wherein, where a size of a region occupied on each optical surface by a beam from a point on an optical axis of the first surface is defined as a partial diameter, the projection optical system satisfies the following condition:

$$0.07 < P3/PX < 0.23 \quad (4),$$

where PX is a maximum partial diameter in the projection optical system and P3 is a minimum partial diameter in the third lens unit.

7. The projection optical system according to claim 6, satisfying the following condition:

$$0.35 < D3/D0 < 0.85 \quad (5),$$

where D3 is a minimum clear aperture radius of a lens in the third lens unit and D0 is a clear aperture radius of the first surface.

8. An exposure apparatus comprising:
    an illumination system which illuminates a mask set as the first surface; and
    the projection optical system as set forth in claim 2, which forms an image of a pattern formed on the mask, on a photosensitive substrate set as the second surface.

9. The exposure apparatus according to claim 8,
    wherein the image of the pattern is formed in a portion on the photosensitive substrate in a state in which the mask and the photosensitive substrate are kept still relative to the projection optical system, and wherein at least the photosensitive substrate is moved relative to the projection optical system, in order to form the image of the pattern in another portion different from the portion, in the state in which the mask and the photosensitive substrate are kept still relative to the projection optical system.

10. The exposure apparatus according to claim 9,
wherein the portion and the different portion of a shot-area overlap in part with each other.

11. The projection optical system according to claim 1, comprising the following lens units arranged in order from the first surface side:
a first lens unit having a positive refracting power;
a second lens unit having a negative refracting power;
a third lens unit having a positive refracting power;
a fourth lens unit having a negative refracting power;
a fifth lens unit having a positive refracting power;
an aperture stop; and
a sixth lens unit having a positive refracting power;
wherein, where a size of a region occupied on each optical surface by a beam from a point on an optical axis of the first surface is defined as a partial diameter, the projection optical system satisfies the following condition:

$$0.04 < P2/PX < 0.2 \quad (2),$$

where PX is a maximum partial diameter in the projection optical system and P2 is a minimum partial diameter in the second lens unit.

12. The projection optical system according to claim 11, satisfying the following condition:

$$0.4 < D4/D0 < 0.9 \quad (3),$$

where D4 is a minimum clear aperture radius of a lens in the fourth lens unit and D0 is a clear aperture radius of the first surface.

13. The projection optical system according to claim 12, wherein the medium contains water.

14. An exposure apparatus comprising:
an illumination system which illuminates a mask set as the first surface; and
the projection optical system as set forth in claim 12, which forms an image of a pattern formed on the mask, on a photosensitive substrate set as the second surface.

15. The exposure apparatus according to claim 14,
wherein the image of the pattern is formed in a portion on the photosensitive substrate in a state in which the mask and the photosensitive substrate are kept still relative to the projection optical system, and wherein at least the photosensitive substrate is moved relative to the projection optical system, in order to form the image of the pattern in another portion different from the portion, in the state in which the mask and the photosensitive substrate are kept still relative to the projection optical system.

16. The exposure apparatus according to claim 15,
wherein the portion and the different portion of a shot-area overlap in part with each other.

17. The projection optical system according to claim 1, comprising the following lens units arranged in order from the first surface side:
a first lens unit having a negative refracting power;
a second lens unit having a positive refracting power;
a third lens unit having a negative refracting power;
a fourth lens unit having a positive refracting power;
an aperture stop; and
a fifth lens unit having a positive refracting power;
wherein, where a size of a region occupied on each optical surface by a beam from a point on an optical axis of the first surface is defined as a partial diameter, the projection optical system satisfies the following condition:

$$0.07 < P3/PX < 0.23 \quad (4),$$

where PX is a maximum partial diameter in the projection optical system and P3 is a minimum partial diameter in the third lens unit.

18. The projection optical system according to claim 17, satisfying the following condition:

$$0.35 < D3/D0 < 0.85 \quad (5),$$

where D3 is a minimum clear aperture radius of a lens in the third lens unit and D0 is a clear aperture radius of the first surface.

19. The projection optical system according to claim 18, wherein the medium contains water.

20. An exposure apparatus comprising:
an illumination system which illuminates a mask set as the first surface; and
the projection optical system as set forth in claim 18, which forms an image of a pattern formed on the mask, on a photosensitive substrate set as the second surface.

21. The exposure apparatus according to claim 20,
wherein the image of the pattern is formed in a portion on the photosensitive substrate in a state in which the mask and the photosensitive substrate are kept still relative to the projection optical system, and wherein at least the photosensitive substrate is moved relative to the projection optical system, in order to form the image of the pattern in another portion different from the portion, in the state in which the mask and the photosensitive substrate are kept still relative to the projection optical system.

22. The exposure apparatus according to claim 21,
wherein the portion and the different portion of a shot-area overlap in part with each other.

23. An exposure apparatus comprising:
an illumination system which illuminates a mask set as the first surface; and
the projection optical system as set forth in claim 1, which forms an image of a pattern formed on the mask, on a photosensitive substrate set as the second surface.

24. The exposure apparatus according to claim 23,
wherein the image of the pattern is formed in a portion on the photosensitive substrate in a state in which the mask and the photosensitive substrate are kept still relative to the projection optical system, and wherein at least the photosensitive substrate is moved relative to the projection optical system, in order to form the image of the pattern in another portion different from the portion, in the state in which the mask and the photosensitive substrate are kept still relative to the projection optical system.

25. The exposure apparatus according to claim 24,
wherein the portion and the different portion of a shot-area overlap in part with each other.

26. An exposure method comprising:
an illumination step of illuminating a mask set as the first surface; and
an exposure step of effecting a projection exposure of an image of a pattern formed on the mask, onto a photosensitive substrate set as the second surface, through the projection optical system as set forth in claim 1.

27. The exposure method according to claim 26,
wherein the exposure step comprises performing a projection exposure in one shot-area having a plurality of partial exposure regions, and
wherein the exposure step further comprises a plurality of partial exposure steps each of which is to perform a projection exposure in the partial exposure region.

28. The exposure method according to claim 27,
wherein the partial exposure step comprises performing a projection exposure in a partial exposure region having a size of approximately a quarter of the one shot-area, and
wherein the exposure step comprises at least four the partial exposure steps.

29. The exposure method according to claim 27,
wherein the partial exposure step comprises performing a still projection exposure in the partial exposure region in a state in which the mask and the photosensitive substrate are kept still relative to the projection optical system.

30. The exposure method according to claim 27, further comprising:
a mask replacing step of replacing the mask with another between the first partial exposure step and the second partial exposure step in the exposure step.

31. The exposure method according to claim 30,
wherein the exposure step is to perform projection exposures in a plurality of shot-areas, and
wherein the mask replacing step is executed between the first partial exposure step for the plurality of shot-areas and the second partial exposure step for the plurality of shot-areas.

32. An exposure method of effecting a projection exposure of a reduced image of a pattern formed on a mask, through a projection optical system onto a photosensitive substrate, the exposure method comprising:
a preparation step of preparing the projection optical system having a magnification of not more than $1/8$;
a filling step of filling an optical path between the projection optical system and the photosensitive substrate with a medium having a refractive index larger than 1.1, where a refractive index of an atmosphere in an optical path of the projection optical system is 1; and
an exposure step of effecting a projection exposure in one shot-area on the photosensitive substrate,
wherein the exposure step comprises the projection exposure in one shot-area including a plurality of partial exposure regions, and
wherein the exposure step further comprises a plurality of partial exposure steps each of which is to perform a projection exposure in the partial exposure region.

33. The exposure method according to claim 32,
wherein the partial exposure step comprises performing a projection exposure in a partial exposure region having a size of approximately a quarter of the one shot-area, and
wherein the exposure step comprises at least four the partial exposure steps.

34. The exposure method according to claim 33,
wherein the partial exposure step comprises performing a still projection exposure in the partial exposure region in a state in which the mask and the photosensitive substrate are kept still relative to the projection optical system.

35. The exposure method according to claim 34, further comprising:
a mask replacing step of replacing the mask with another between the first partial exposure step and the second partial exposure step of the exposure step.

36. The exposure method according to claim 35,
wherein the exposure step further comprises performing projection exposures in a plurality of shot-areas, and
wherein the mask replacing step is executed between the first partial exposure step for the plurality of shot-areas and the second partial exposure step for the plurality of shot-areas.

* * * * *